US006771070B2

(12) United States Patent
Lee

(10) Patent No.: US 6,771,070 B2
(45) Date of Patent: Aug. 3, 2004

(54) APPARATUS FOR MAGNETIC RESONANCE IMAGING HAVING A PLANAR STRIP ARRAY ANTENNA INCLUDING SYSTEMS AND METHODS RELATED THERETO

(75) Inventor: Ray F Lee, Clifton-Park, NY (US)

(73) Assignee: Johns Hopkins University, Baltimore, MD (US)

( * ) Notice: Subject to any disclaimer, the term of this patent is extended or adjusted under 35 U.S.C. 154(b) by 73 days.

(21) Appl. No.: 09/822,771

(22) Filed: Mar. 30, 2001

(65) Prior Publication Data

US 2002/0180439 A1 Dec. 5, 2002

(51) Int. Cl.[7] .............................. G01V 3/00; H01Q 9/16; H01Q 7/00; H01Q 1/00
(52) U.S. Cl. ................................. 324/318; 343/700 MS
(58) Field of Search ................................ 324/300–322; 343/700 MS, 731; 333/230

(56) References Cited

U.S. PATENT DOCUMENTS

| | | | | |
|---|---|---|---|---|
| 3,789,832 A | | 2/1974 | Damadian ..................... | 128/2 R |
| 4,638,253 A | * | 1/1987 | Jaskolski et al. ............ | 324/311 |
| 4,751,464 A | * | 6/1988 | Bridges ........................ | 324/318 |
| 4,783,641 A | | 11/1988 | Hayes et al. ................. | 333/219 |
| 4,825,162 A | | 4/1989 | Roemer et al. .............. | 324/318 |
| 4,968,937 A | | 11/1990 | Akgun ......................... | 324/318 |
| 5,017,872 A | * | 5/1991 | Foo et al. .................... | 324/322 |
| 5,212,450 A | * | 5/1993 | Murphy-Boesch et al. . | 324/322 |
| 5,270,656 A | * | 12/1993 | Roberts et al. .............. | 324/318 |
| 5,363,845 A | | 11/1994 | Chowdhury et al. ...... | 128/653.5 |
| 5,365,172 A | | 11/1994 | Hrovat et al. ................ | 324/309 |
| 5,367,261 A | * | 11/1994 | Frederick .................... | 324/318 |
| 5,467,017 A | | 11/1995 | Duerr et al. ................. | 324/318 |
| 5,523,689 A | | 6/1996 | Oppelt et al. ............... | 324/318 |
| 5,621,322 A | * | 4/1997 | Ehnholm ..................... | 324/318 |
| 5,642,048 A | * | 6/1997 | Crozier et al. .............. | 324/318 |
| 5,744,957 A | | 4/1998 | Vaughan, Jr. ................ | 324/318 |
| 5,898,306 A | * | 4/1999 | Liu et al. ..................... | 324/322 |
| 5,910,728 A | | 6/1999 | Sodickson ................... | 324/309 |

(List continued on next page.)

OTHER PUBLICATIONS

Wright, et al., "Arrays of Mutually Coupled Receiver Coils: Theory and Application", Magnetic Resonance in Medicine 17, 252–268 (1991).

Roemer, et al., "The NMR Phased Array", Magnetic Resonance in Medicine 16, 192–225 (1990).

Vaughan, et al., "High Frequency Volume Coils for Clinical NMR Imaging and Spectroscopy", MRM 32:206–218 (1994).

Primary Examiner—Diego Gutierrez
Assistant Examiner—Dixomara Vargas
(74) Attorney, Agent, or Firm—Peter F. Corless; William J. Daley, Jr.; Edwards & Angell, LLP

(57) ABSTRACT

Featured is a device for detecting electromagnetic signals, more specifically, the magnetic resonance signals from excited nuclei as well as related apparatuses, systems and methods. The detection device includes a planar strip array antenna including a plurality, and in more particular embodiments a multiplicity of parallel conductors (e.g., 4, 16, 32 or more of conductors). The length of the conductors is adjusted to substantially reduce the coupling of a signal in one conductor to an adjacent conductor(s). In a more specific embodiment the length is set so as to be equal to be about $n\lambda/4$, where n is an integer $\geq 1$ and $\lambda$ is the wavelength of the signal to be detected (e.g., the wavelength corresponding to the NMR resonance frequency for the nuclei). The device also is configured so that the electromagnetic wave on each conductor is one of a standing wave or a traveling wave. Additionally, the device is configurable to provide broad band de-coupling by controlling a ratio of the spacing between conductors and the height of an encapsulation member so as to be less than or equal to a given value. Such a device can further include an EMF interference guard so as to isolate at least a portion of the conductors.

62 Claims, 10 Drawing Sheets

U.S. PATENT DOCUMENTS

| | | | | |
|---|---|---|---|---|
| 5,990,681 A | * | 11/1999 | Richard et al. | 324/318 |
| 5,998,999 A | * | 12/1999 | Richard et al. | 324/318 |
| 6,169,401 B1 | * | 1/2001 | Fujita et al. | 324/318 |
| 6,236,206 B1 | * | 5/2001 | Hartman et al. | 324/318 |
| 6,252,403 B1 | * | 6/2001 | Alsop | 324/318 |
| 6,285,189 B1 | * | 9/2001 | Wong | 324/318 |
| 6,316,941 B1 | * | 11/2001 | Fujita et al. | 324/318 |
| 6,396,271 B1 | * | 5/2002 | Burl et al. | 324/318 |
| 6,420,871 B1 | * | 7/2002 | Wong et al. | 324/318 |

* cited by examiner

APPARATUS FOR MAGNETIC RESONANCE IMAGING HAVING A PLANAR STRIP ARRAY ANTENNA INCLUDING SYSTEMS AND METHODS RELATED THERETO

FIELD OF INVENTION

The present invention generally relates to apparatus and methods for magnetic resonance imaging (MRI), also known as nuclear magnetic resonance imaging (NMRI). More particularly the present invention relates to an apparatus having a near-field radio-frequency planar strip array antenna that can be used for parallel spatial encoded and for conventional series spatial encoded MRI. The present invention also relates to methods and MRI systems related thereto.

BACKGROUND OF THE INVENTION

Magnetic resonance imaging (MRI) is a technique that is capable of providing three-dimensional imaging of an object. A conventional MRI system typically includes a main or primary magnet(s) that provides the background magnetic field $B_o$, gradient coils and radio frequency (RF) coils, which are used for spatial encoding, exciting and detecting the nuclei for imaging. Typically, the main or primary magnet(s) are designed to provide a homogeneous magnetic field in an internal region within the main magnet, for example, in the air space of a large central bore of a solenoid or in the air gap between the magnetic pole plates of a C-type magnet. The patient or object to be imaged is positioned in the homogeneous field region located in such air space. The gradient field and the RF coils are typically located external to the patient or object to be imaged and inside the geometry of the main or primary magnet(s) surrounding the air space. There is shown in U.S. Pat. Nos. 4,968,937 and 5,990,681, the teachings of which are incorporated herein by reference, some exemplary MRI systems.

In MRI, the uniform magnetic field $B_o$ generated by the main or primary magnet(s) is applied to an imaged object by convention along the Z-axis of a Cartesian coordinate system, the origin of which is within the imaged object. The uniform magnetic field $B_o$ being applied has the effect of aligning the nuclear spins, a quantum mechanical property of macroscopic particles comprising the imaged object, along the Z-axis. In response to RF pulses of the proper frequency, that are orientated within the XY plane, the nuclei resonate at their Larmor frequencies. In a typical imaging sequence, the RF signal centered about the desired Larmor frequency is applied to the imaged object at the same time a magnetic field gradient $G_z$ is being applied along the Z-axis. This gradient field $G_z$ causes only the nuclei in a slice with a limited width through the object along the XY plane, to have the resonant frequency and to be excited into resonance.

After excitation of the nuclei in the slice, magnetic field gradients are applied along the X- and Y-axes respectively. The gradient $G_x$ along the X-axis causes the nuclei to precess at different frequencies depending on their position along the X-axis, that is, $G_x$ spatially encodes the precessing nuclei by frequency (i.e., frequency encoding). The Y-axis gradient $G_y$ is incremented through a series of values and encodes the Y position into the rate of change of the phase of the precessing nuclei as a function of gradient amplitude, a process typically referred to as phase encoding.

The quality of the image produced by the MRI techniques is dependent, in part, upon the strength of the magnetic resonance (MR) signal received from the precessing nuclei. For this reason an independent RF coil is placed in close proximity to the region of interest of the imaged object in order to improve the strength of the received signal. Such RF coils are sometimes referred to as local coils or surface coils.

There is described in U.S. Pat. No. 4,825,162 a surface coil(s) for use in MRI/NMRI imaging and methods related thereto. In the preferred embodiment of that invention, each surface coil is connected to the input of an associated one of a like plurality of low-input-impedance preamplifiers, which minimize the interaction between any surface coil and any other surface coils not immediately adjacent thereto. These surface coils can have square, circular and the like geometries. This yields an array of a plurality of closely spaced surface coils, each positioned so as to have substantially no interaction with all adjacent surface coils. A different MR response signal is received at each different one of the surface coils from an associated portion of the sample enclosed within the imaging volume defined by the array. Each different MR response signal is used to construct a different one of a like plurality of different images then being combined, on a point-by-point, basis to produce a single composite MR image of a total sample portion from which MR response signal distribution was received by any of the array of surface coils.

The use of a phased array RF coils or surface coils with a tuned and matched circuit including low impedance preamplifiers have been used to de-couple adjacent loops as a mechanism for improving the signal-to-noise ratio (SNR) and field of view (FOV). In this regard, it should be understood that the term "coupling" refers to the coupling of an MR signal in one coil to an adjacent coil(s), such that the signal being outputted by the adjacent coil is a combination of the MR signal detected by the adjacent coil and the coupled MR signal. Consequently, the image from the adjacent coil would be distorted to some degree. Although overlapping adjacent coil(s) and using low impedance preamplifiers have been effective from the standpoint of improving SNR and FOV, such circuitry becomes ineffective when both the number of coils and the coil density is increased. In other words, as the spacing between adjacent coils and between adjacent portions of a coil is decreased signal coupling is increased irrespective of the tuned and matched circuits.

Although there are a variety of spatial encoding methodologies or techniques being implemented, the most popular method used in commercial MRI scanners is two-dimensional Fourier transform (2DFT) encoding in which a two-dimensional spatial plane (e.g., XY plane) is encoded with both frequency and phase of the MR signals. Typically during one data acquisition, only a one dimensional time-domain signal is obtained and thus 2DFT encoding requires repeating the data acquisitions sequentially to achieve a pseudo second dimension of the time domain signals. The second dimension of the spatial information is encoded into the phase component by repeating the data acquisition with different phase encoding gradient strengths (i.e., varying $G_y$ to create the other pseudo-time dimension. In this technique, each slice of the imaged object is in effect divided into a multiplicity of layers in the Y-direction or axis corresponding to the number of pixels in that direction (e.g., 128, 256). The number of pixels in turn is representative of the desired image resolution, in other words the higher the resolution the higher the number of pixels. In addition, the X-direction scanning process or the data acquisition is repeated by sequentially and repeatedly stepping through each of these Y-direction layers. Because the resolution of the time-domain signals depends on the number of repetitions of the data acquisitions, and the repetition rate is limited by the MR relaxation times; a higher resolution image takes a longer time.

Two recent methods, the Simultaneous Acquisition of Spatial Harmonics (SMASH) imaging in the time domain and the Sensitivity Encoded (SENSE) imaging in the frequency domain, changes such sequential data acquisition into a partially parallel process by using a phased array, thereby reducing the scan time as compared to the sequential data acquisition technique. In these two techniques, it is recognized that the data sampled below the Nyquist sampling rate can be recovered if the sensitivity profiles of the phased array detectors can provide enough spatial information to either interpolate the data in the time domain or unwrap the data in the frequency domain.

The time domain method recognizes the equivalence between phase-encoding with MRI gradients and the composite spatial sensitivity inherent in the detectors. It uses a numerical fitting routine to, among other things, interpolate a decimated number of phase-encoding steps and thus, achieve reductions in scan time. Although this numerical approach was instrumental in demonstrating the original SMASH concept, it did not recognize the underlying analytical relationship between the weighting factors for the composite harmonics, the FOV, the spacing of the detectors, the harmonic orders, and the sensitivity profiles of the detector coils.

Another problem is that conventional MRI phased array coils are unable to deploy a large number of coils due to the limitations imposed by both their loop structure and the de-coupling requirements for the mutual induction between the elements. Because the number of coils in the phased array corresponds to the maximum decimation factor for reducing the number of phase encoding steps, existing phased array designs significantly limit the potential for parallel spatial encoding.

It thus would be desirable to provide an array antenna or RF MR signal detector, as well as systems and methods embodying such an antenna/detector, that would allow the number of antenna elements for detecting near filed signals in the array antenna to be increased while maintaining the de-coupling of adjacent antenna elements and the desired SNR and FOV characteristics. It would be particularly desirable to provide such array antenna/detector, system and method in which the array antenna includes a multiplicity of elements for detecting MR signals, such as 6 or more, 32 or more or 64 or more elements so as to significantly reduce scan time. Such an array antenna/MR signal detector preferably would be simple in construction as compared to prior art antennas and/or MR signal detectors.

SUMMARY OF THE INVENTION

The present invention features a device for detecting or receiving electromagnetic signals and more particularly a device for detecting magnetic resonance (MR) signals from excited nuclei. Also featured are a detection apparatus embodying such a device, an MR excitation and signal detection apparatus embodying such a device, a magnetic resonance imaging (MRI) system embodying such a device and/or such an MR excitation and signal detection apparatus. Further featured are methods related to the above-described detection device, apparatuses and system.

The detection device includes a plurality of conductors being arranged so as to be parallel to each other. Each of the conductors has a length that is set so as to substantially reduce the coupling of a signal in one of the conductors to an adjacent conductor. More particularly, the conductor length is set so as to be equal to be about $n\lambda/4$, where n is an integer $\geq 1$ and $\lambda$ is the wavelength of the signal to be detected. For MRI applications, $\lambda$ is the wavelength corresponding to the NMR resonance frequency for the nuclei being subjected to a given magnetic field strength by the main or primary magnetic coils. For example, the quarter wavelength for a proton NMR in a 1.5 Telsa magnetic field in air is about 117 cm.

In a specific embodiment, the detection device includes a multiplicity of parallel conductors, more particularly, about four or more conductors. In another specific embodiment, the detection device includes sixteen (16) or more conductors, more particularly thirty-two (32) or more conductors. In a further specific embodiment, the detection device includes a multiplicity of conductors in the range of from about 4 to about 32 conductors, more particularly in the range of from about 4 to about 16 conductors and further in the range of from about 16 to about 32 conductors.

The detection device further includes an encapsulation member comprising a substrate, on one surface of which is disposed the plurality of conductors and the other opposing surface thereof is disposed a ground plane, and an overlay that covers the conductors disposed on the substrate. The substrate and the overlay are made of a material having a dielectric constant so the wavelength of the electromagnetic wave on the each conductor is reduced so as to be in a desired range for purposes of scanning. In an exemplary embodiment, the encapsulation material has a dielectric constant in the range of from about 6 to 9.6 such that the quarter wavelength for a proton NMR in a 1.5 Telsa magnetic field on each encapsulated conductor is in the range of from about 48 cm to 38 cm. The ground plane is an electrical conductive material including, but not limited to, copper, aluminum or silver. The ground plane, as is known to those skilled in the art, is applied or otherwise secured to the other opposing surface and to keep EMF on strip in a quasi-TEM mode.

In other specific embodiments, the detection device is configured to operate such that the electromagnetic (EM) wave on each of the conductors is one of a standing wave or a traveling wave. In the case of a standing wave, the detection device further includes a mechanism that terminates one end of each conductor as one of an open circuit or a short circuit. In the case of a traveling wave, n is an even number such that the length of each conductor is a multiple of $\lambda/2$ and a termination of each conductor is a resistive match.

Additionally, the detection device can be configured to include an electromagnetic field (EMF) interference guard that is electrical connected in a fashion so that the guard electrical isolates at least a portion of each conductor (e.g., the ends of the conductors) to minimize the EMF interference to the plurality of conductors by/from the environment including areas of the imaged object outside of the specific area being scanned. In one embodiment, the EMF interference guard includes two guard strips, each guard strip being disposed proximal the ends of each conductor strip and so as to minimize EMF interference from environmental electromagnetic waves approaching the ends of each conductor. In a more specific embodiment, a long axis for each of the guard strips extends generally perpendicular to a long axis of each conductor.

In another embodiment, a plurality or more of guard strips are arranged about the periphery of the plurality of conductors so as to, in effect encircle the ends and sides of the plurality of conductors. In yet another embodiment, the EMF interference guard comprises one or more members that are configured so as to be provide any of a number of geometrical shapes such as circular and oval. These one or more members are formed about the ends or about the periphery of the plurality of conductors such that the configuration minimizes external EMF interference. In a more specific embodiment, the EMF interference guard or each guard strip thereof is electrical connected to ground.

According to another aspect of the invention, the plurality of conductors are arranged so as to provide both narrow band de-coupling, as described above, and broadband de-coupling of the conductors. In specific embodiments, such broad-band de-coupling can be realized when the spacing ("s") between the conductors and the height ("h") of the encapsulation member is set so a ratio s/h is greater than or equal to about 3 or about 2.5.

Also featured are a detection apparatus including a detection device, having a plurality of conductors as described above, and a plurality of receivers, one receiver for each conductor. In a more specific embodiment when using the detection apparatus in an MRI system, the detection apparatus further includes a plurality of transmit/receive (T/R) switching mechanisms (e.g., switches) one for each conductor/receiver path. The T/R switching mechanisms are configured and arranged so as to de-couple each detection device conductor from its corresponding receiver during the period of time when an excitation electromagnetic signal is being generated to depress the magnet moment of the nuclei within the imaged object and also to couple each detection device conductor with its corresponding receiver during the time period when the excitation electromagnetic signal is not being generated, such as when a MR signal is to be detected.

Additionally there is featured an excitation and detection system including the features described above for the detection system. Such an excitation and detection system further includes a transmitter that generates the excitation electromagnetic signals or pulses, an antenna for transmitting these signals into at least the region of the imaged object to be scanned, and a controller that selectively controls signal transmission and signal reception so that each occurs at predetermined times and/or predetermined time intervals.

Further, there is featured a MRI system including the excitation and detection system described above, a main or primary coil that generates a homogeneous magnetic field in a predetermined region in which the object or portion thereof is to be imaged, gradient coils for generating one or additional magnetic fields, controllers for controlling the operation and energization of each of the main and gradient coils, the generation/transmission of the excitation electromagnetic (RF) signals and the acquisition/detection of MR signals by the detection system. Such a system further includes a processing apparatus that processes the data acquired so as to yield an image of the object that was scanned.

Other aspects and embodiments of the invention are discussed below.

BRIEF DESCRIPTION OF THE DRAWING

For a fuller understanding of the nature and desired objects of the present invention, reference is made to the following detailed description taken in conjunction with the accompanying drawing figures wherein like reference character denote corresponding parts throughout the several views and wherein.

DESCRIPTION OF THE PREFERRED EMBODIMENT

Figure 1A:
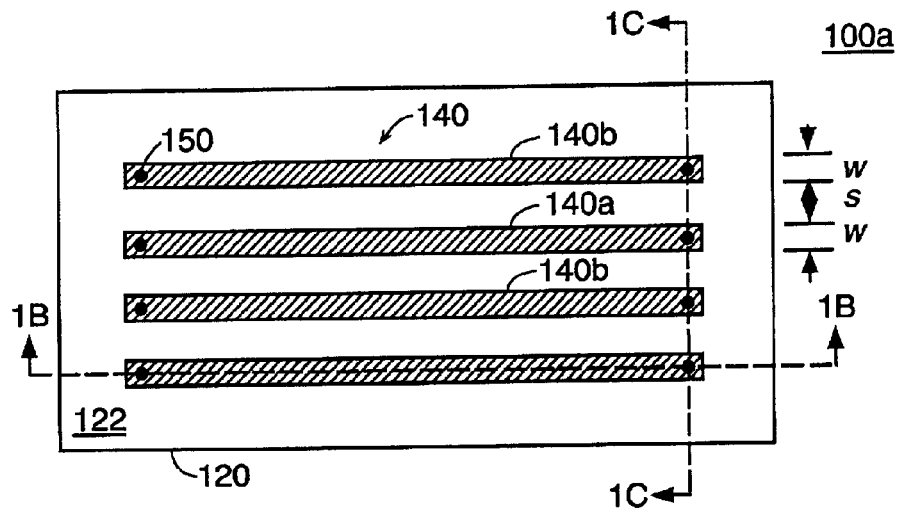
FIG. 1A is a top view of a near-field RF planar strip array antenna according to one aspect of the present invention with the overlay removed for clarity.

Referring now to the various figures of the drawing wherein like reference characters refer to like parts, there is shown in FIGS. 1–3 various views of near-field RF planar strip array (PSA) antennas 100a–c according to present invention. In the following, reference numerals 100, 130 and 140 are used when generally referring respectively to a PSA antennas according to any embodiment of the present invention, to the overlay thereof and to any or all of the conductor strips thereof. When reference is being made to a specific PSA antenna embodiment, to a specific conductor strip or to a specific overlay configuration to more particularly illustrate or describe a specific feature or effect, however, an alpha character shall be added to the reference numeral (e.g., 100*a*, 130*b*, 140*c*, etc.) to identify the specific PSA embodiment, overlay or conductor strip.

Figure 1B:
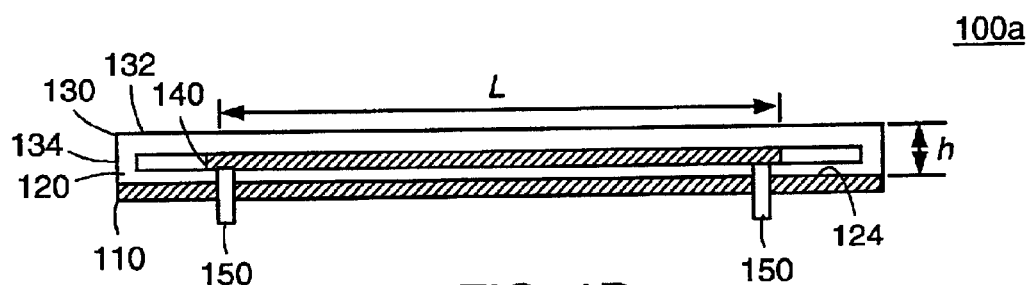
FIG. 1B is a cross-sectional view of the near-field RF planar strip array antenna of FIG. 1A with the overlay taken along line 1B—1B.
Figure 1C:
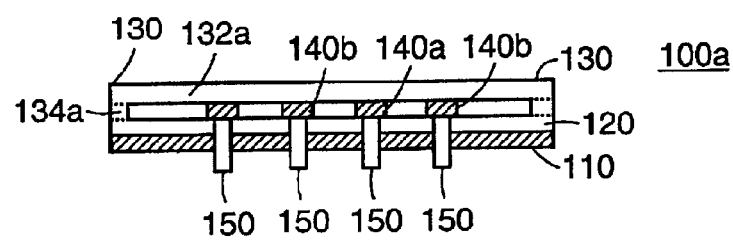
FIG. 1C is a cross-sectional view of the near-field RF planar strip array antenna of FIG. 1A with the overlay taken along line 1C—1C.

Now referring to FIGS. 1A–C, there is shown various views of a near-field RF planar strip array (PSA) antenna 100*a* according to one aspect of the present invention that includes a ground plane 110, substrate 120, an overlay 130*a* and a plurality of conductor strips 140. The PSA antenna 100 also includes a plurality of BNC surface or panel mounts 150 as is known to those skilled in the art. In an exemplary embodiment, as illustrated in FIG. 1A, a BNC panel or surface mount 150 is provided proximal each end of each conductor strip 140 to provide one of a feeding point and a termination point as more particularly described hereinafter. The BNC mounts or connectors 150, however, shall not be construed as a limitation, as other connectors or mounts known to those skilled in the art, such as SMA or SMB type, are contemplated for use with any PSA antenna of the present invention. SMA or SMB type connectors may have particular use in cases where a PSA antenna is configured with a multiplicity or more of conductor strips 140 such as that shown in FIGS. 4–5.

The ground plane 110, as is known to those skilled in the art, is made of an electrical conductive material including, but not limited to, copper, aluminum or silver. The ground plane is applied or otherwise secured or attached to a surface, the bottom surface 124, of the substrate 120. In a specific, exemplary embodiment, the ground plane 110 is electrically connected to ground.

The plurality of conductor strips 140 are disposed on a top surface 122 of the substrate 120, the top surface is opposite to and spaced from the ground plane 110. The plurality of conductor strips 140 are secured to the substrate top surface using any of a number of techniques known to those skilled in the art. In the illustrated embodiment, the conductor strips 140 are secured to the substrate top surface 122 as a consequence of securing each of the conductor strips to the BNC panel or surface mounts 150. In an alternative embodiment, the conductor strips 140 are applied on the substrate top surface 122 such as, for example, by using any of a number well known photo-lithographic techniques. It also is within the scope of the present invention for any of a number of techniques known in the art, such as those for making micro-chips, to be adapted for use in disposing the plurality of conductor strips 140 on the substrate top surface 122.

Figure 4:
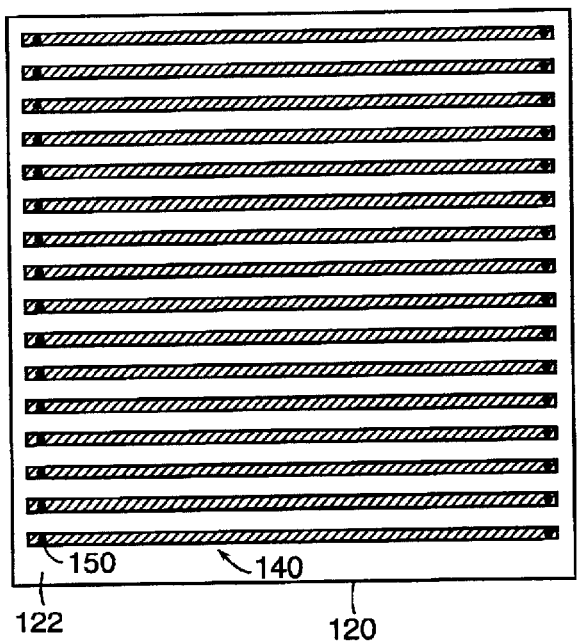
FIG. 4 is a top view of the near-field RF planar strip array antenna of FIG. 1A but configured with 16 conductor strips.
Figure 5:
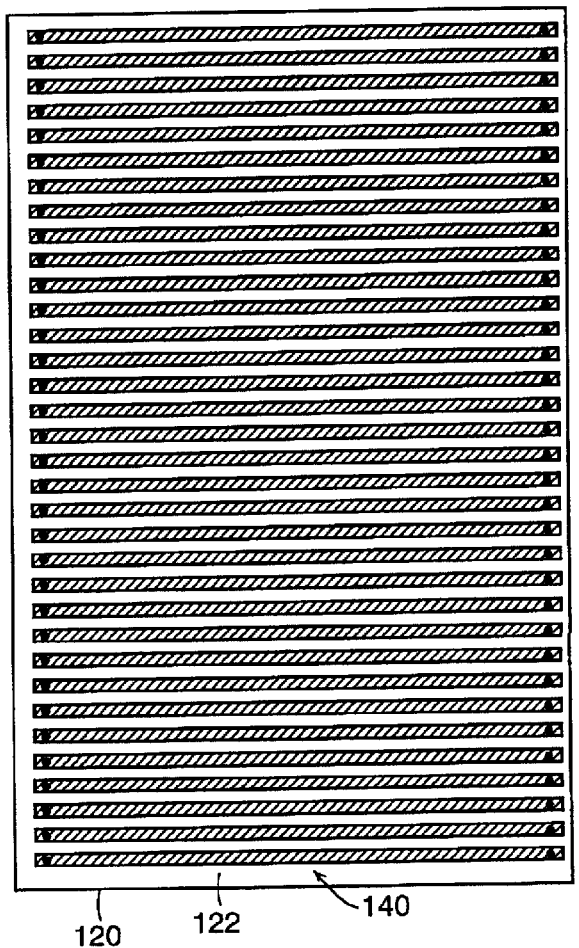
FIG. 5 is a top view of the near-field RF planar strip array antenna of FIG. 1A but configured with 32 conductor strips.

In the illustrated embodiment, the PSA antenna 100*a* includes four conductor strips 140, however, this shall not be construed as a limitation as to the number of conductor strips that can comprise a PSA antenna 100 according to this or any other embodiment of the present invention. In other contemplated embodiments, a PSA antenna 100 according to the present invention includes a plurality or more of conductor strips or a multiplicity or more of conductor strips that are disposed on the substrate top surface 122. In further contemplated embodiments, a PSA antenna 140 according to the present invention includes sixteen (16) or more conductor strips or thirty-two (32) or more conductor strips, as is shown in FIGS. 4–5. In yet further contemplated embodiments, a PSA antenna 100 according to the present invention is configured or arranged so as to include a multiplicity of conductor strips in the range of from about 4 to about 32 conductor strips, more particularly in the range of from about 4 to about 16 conductor strips and further in the range of from about 16 to about 32 conductor strips. Other characteristics of the conductor strips 140, such as length, width and thickness are discussed hereinafter In the embodiment illustrated in FIGS. 1B–C, the overlay 130*a* is applied so as to cover each of the conductor strips 140 and at least a portion of the substrate top surface 122 so the plurality of conductor strips are in effect encapsulated by a member comprising the substrate 120 and the overlay. More particularly, the illustrated embodiment of the overlay 130*a* includes a cover member 132*a* that rests upon the plurality of conductor strips 140 and extends over the substrate top surface 122. In an exemplary embodiment, the cover member 132*a* is a planar member, more specifically having the shape and planar dimensions of the substrate 120. The cover member 132*a* is secured to the substrate top surface 122 using any of number of techniques known in the art. In an exemplary embodiment, the substrate top surface 122 and the opposing surfaces of the cover member 132*a* are preferably secured in areas 134*a* about the periphery of the substrate 120 and/or cover member.

In alternative embodiments, as illustrated in FIGS. 2–3, the overlay 130*b* comprises a material that is applied or deposited upon the conductor strips 140 and the substrate top surface 122 such that the substrate 120 and the overlay 130*b* form in effect an integral structure. Such material deposition or application shall be accomplished using any of a number of techniques known to those skilled in the art, such as for example a thin film deposition technique.

As more particularly described hereinafter, the substrate 120 and the material comprising the overlay 130 are dielectric materials having a dielectric constant that makes the electromagnetic (EM) wave on a given conductor strip 140 lie within an acceptable range for purposes of detection. For example, in a typical MRI application the quarter wavelength in air of 63.87 MHz signal (i.e., the proton NMR frequency in a 1.5 Telsa magnetic field) is about 117 cm. The quarter wavelength, however, would be about 46 cm when the material comprising the substrate 120 and the overlay 130 is a glass having a relative permittivity of 6.4. In specific embodiments, the substrate 120 and the overlay 130 are comprised of the same material having the same dielectric characteristics. It is within the scope of the present invention for the material making up the substrate 120 to be different from the material making up the overlay 130.

For MRI applications in which the main or primary magnetic coil(s) produce a magnetic field having a $B_o$ of 1.5 Telsa, the materials comprising the substrate 120 and the overlay 130 include, but are not limited to, glass ($E_r$=6.4), alumina ($E_r$=9.6) and mica ($E_r$=6). Such materials are exemplary, as any material known in the art can be used that yields a PSA antenna that is otherwise consistent with the use and purpose of a PSA antenna 100 according to the present invention including establishing the length of the conductor strip 130 as hereinafter discussed.

In MRI applications, the material and dielectric properties selected for use as the substrate 120/overlay 130 for use in a PSA antenna 100 according to the present invention are dependent upon a number of factors including the field strength of the main or primary magnetic coils used to establish $B_o$. For example, as the field strength of the main/primary magnetic coil(s) is increased, the proton NMR frequency increases thereby reducing the corresponding wavelength. Consequently, a wider range of materials are available for use in such cases as well as allowing consideration of reducing the relative size of the PSA antenna 100.

Figure 2A:
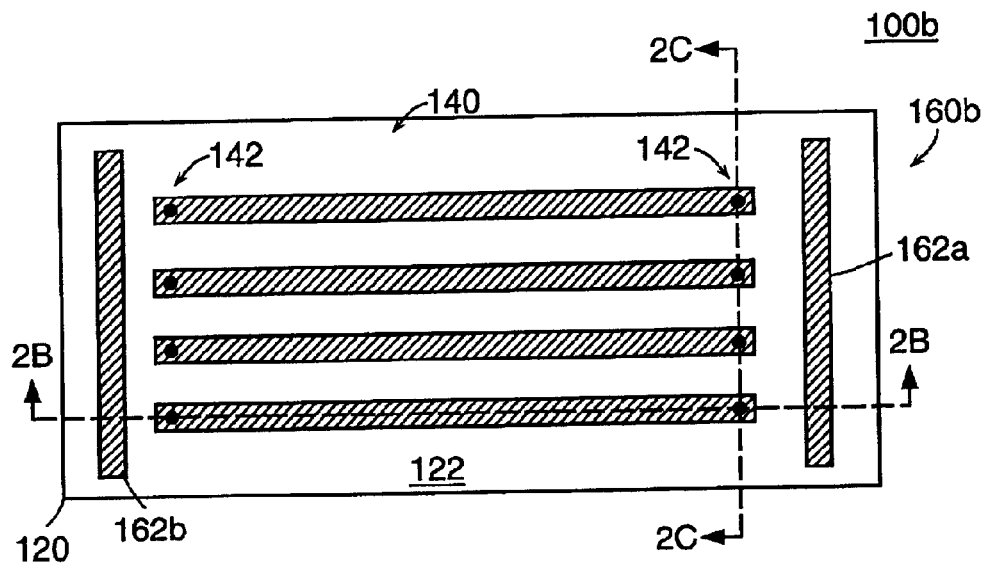
FIG. 2A is a top view of a near-field RF planar strip array antenna according to a second aspect the present invention with the overlay material removed for clarity.
Figure 2B:
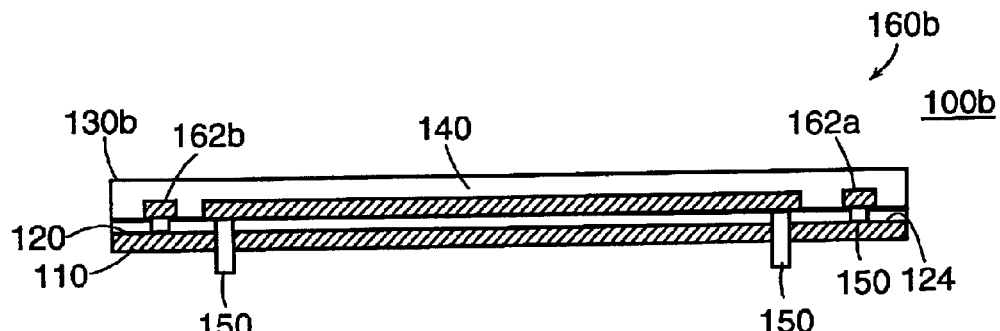
FIG. 2B is a cross-sectional view of the near-field RF planar strip array antenna of FIG. 2A with the overlay taken along line 2B—2B.
Figure 2C:
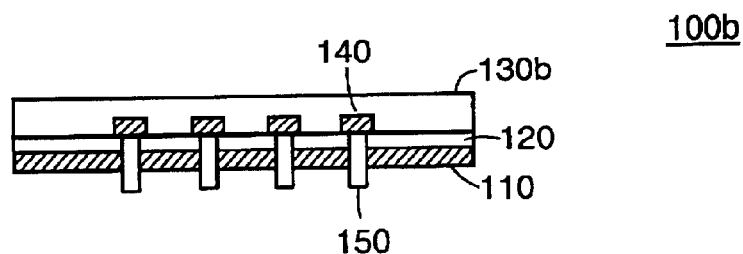
FIG. 2C is a cross-sectional view of the near-field RF planar strip array antenna of FIG. 2A with the overlay taken along line 2C—2C.

Referring now to FIGS. 2A–C, there is shown various views of a near-field RF planar strip array (PSA) antenna 100b according to a second aspect of the present invention. Such a PSA antenna 100b includes a ground plane 110, a substrate 120, an overlay 130b, a plurality of conductor strips 140, a plurality of BNC surface or panel mounts 150, and an electromagnetic field interference (EMF) guard 160b. Reference shall be made to the foregoing discussion regarding FIGS. 1A–C for the ground plane 110, the substrate 120, the overlay 130b, the plurality of conductor strips 140 and the plurality of BNC surface or panel mounts 150 which applies equally to the corresponding structural elements or features for the PSA antenna according to this aspect of the invention.

The EMF guard 160b of this embodiment includes end guard members 162a,b that are arranged on the substrate top surface 122 so as to be proximal the ends 142 of the plurality of conductor strips 140 and are each connected to at least one BNC surface or panel mount 150, more particularly two BNC panel/surface mounts. The end guard members 162a,b are conductive members that are configured and arranged so that EMF effects from the environment, including areas of the object not presently being scanned, are not coupled to the plurality of conductor strips 140; specifically EMF effects and the like coming from areas proximal the conductor strip ends 142. Additionally, the EMF guard members 160a,b are arranged so a long axis of each such member extends in a direction that is at an angle with respect to a long axis of the conductor strips, more specifically they extend in a direction substantially perpendicular to the conductor strip long axis.

The conductive material comprising the end guard members 162a,b includes, but is not limited to copper, aluminum or silver. In specific embodiments, the end guard members 162a,b are electrically connected to ground. In an exemplary embodiment, each of the end guard members 162a,b is a copper member having a width of about 0.635 cm, a thickness of about 2 µm and a length of about 50 cm, although it shall be understood that the end guard members 162a,b as well as the other members making up the EMF guard 160 are not particularly limited to this exemplary embodiment.

Figure 3A:
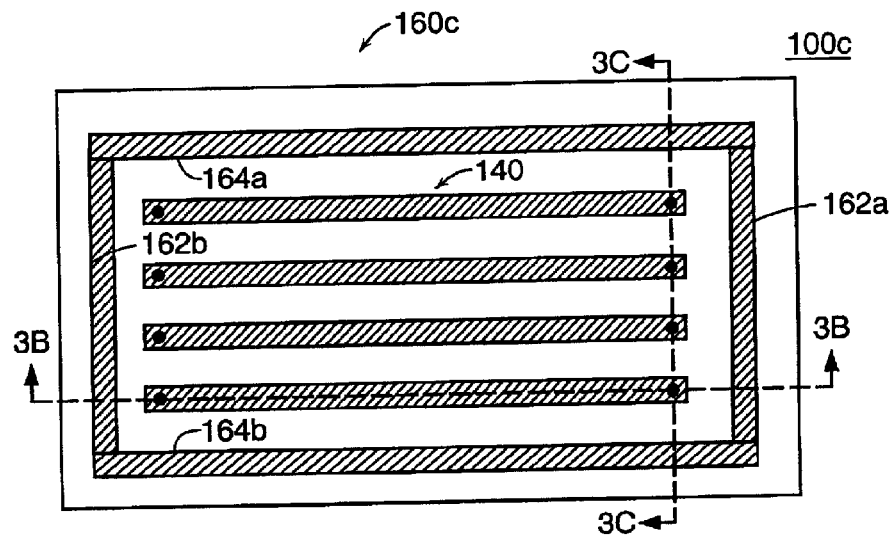
FIG. 3A is a top view of another a near-field RF planar strip array antenna according to the second aspect with the overlay material removed for clarity.
Figure 3B:
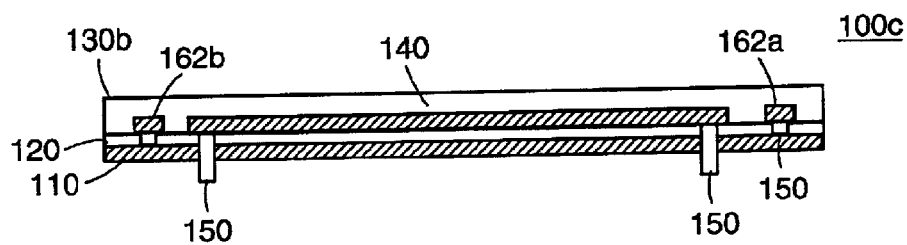
FIG. 3B is a cross-sectional view of the near-field RF planar strip array antenna of FIG. 3A with the overlay taken along line 3B—3B.
Figure 3C:
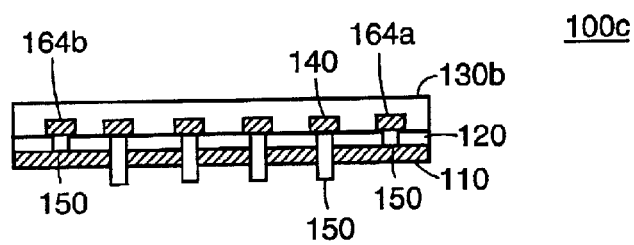
FIG. 3C is a cross-sectional view of the near-field RF planar strip array antenna of FIG. 3A with the overlay taken along line 3C—3C.

There is shown in FIGS. 3A–C, an alternative embodiment of a PSA antenna 100c according to the second aspect of the present invention. Such a PSA antenna 100c includes a ground plane 110, a substrate 120, an overlay 130b, a plurality of conductor strips 140, a plurality of BNC surface or panel mounts 150, and an electromagnetic field interference (EMF) guard 160c. Reference shall be made to the foregoing discussion regarding FIGS. 1A–C for the ground plane 110, the substrate 120, the overlay 130b, the plurality of conductor strips 140 and the plurality of BNC surface or panel mounts 150 which applies equally to the corresponding structural elements or features for the PSA antenna according to this aspect of the invention. Reference also should be made to the foregoing discussion regarding FIGS. 2A–C for common details/information regarding the EMF guard 160c of this embodiment not otherwise provided below (e.g., for material composition and sizing).

The EMF guard 160c of this embodiment includes end guard members 162a, b and side guard members 164a,b that are arranged on the substrate top surface 122 so as to lie about the periphery of the array of conductor strips 140, where each end and side guard member 162a,b; 164a,b is connected to at least one BNC surface or panel mount 150, more particularly two BNC panel/surface mounts. The end and side guard members 162a,b; 16a,b are configured and arranged so that EMF effects from the environment, including areas of the object not presently being scanned, are not coupled to the plurality of conductor strips 140.

Although the EMF guard 160c is illustrated as being composed of four guard members, this shall not be construed as a limitation as to the configuration and arrangement of the EMF guard. It is within the scope of the present invention for the EMF guard 160 to comprise one or more members that are configured so as to form any of a number of geometric shapes known to those skilled in the art (e.g., rectilinear, circular, oval, etc.) that would be otherwise consistent with the shielding the array of conductor strips 140 comprising a PSA antenna 100 according to the present invention from external EMF effects and the like. For example, the EMF guard 160c can be configured so as to form a rectangular member sized to be spaced from and extending about the periphery of the array of conductor strips 140. Similarly, the EMF guard 160c can comprise two L-shaped or U-shaped members that form a rectangular member spaced from and extending about the periphery of the array of conductor strips 140 when the members are disposed on the substrate top surface 122 and joined together. Similarly, the U-shaped or L-shaped members can be arranged on the substrate top surface 122 so the structure formed has gaps between the sections. It should be recognized that such examples are not exhaustive and that other shapes and configurations are contemplated.

Each of the conductor strips 140 have a length "l" that is particularly set so as to substantially reduce the coupling of an electromagnetic (EM) signal on one conductor strip 140a from being coupled to an adjacent conductor strip(s) 140b. Thus, avoiding distortion of the EM signal on the adjacent conductor strip(s) 140b. In the case where the EM signal on each conductor strip 140 is a standing wave, the length of each conductor strip 140 is set so as to be equal to be about $n\lambda/4$, where n is an integer$\geq 1$ and $\lambda$ is the wavelength of the signal to be detected. In specific embodiments n satisfies the inequality $1 \geq n \leq 2$. For MRI applications, $\lambda$ is the wavelength corresponding to the NMR resonance frequency for the nuclei being subjected to a given magnetic field strength by the main or primary magnetic coils. In the case where the EM signal on each conductor strip 140 is a traveling wave, the length of each conductor strip 140 is set so as to be equal to be about $n\lambda/4$, where n is an even integer$\geq 1$; in a more specific embodiment, n=2.

Figure 6:
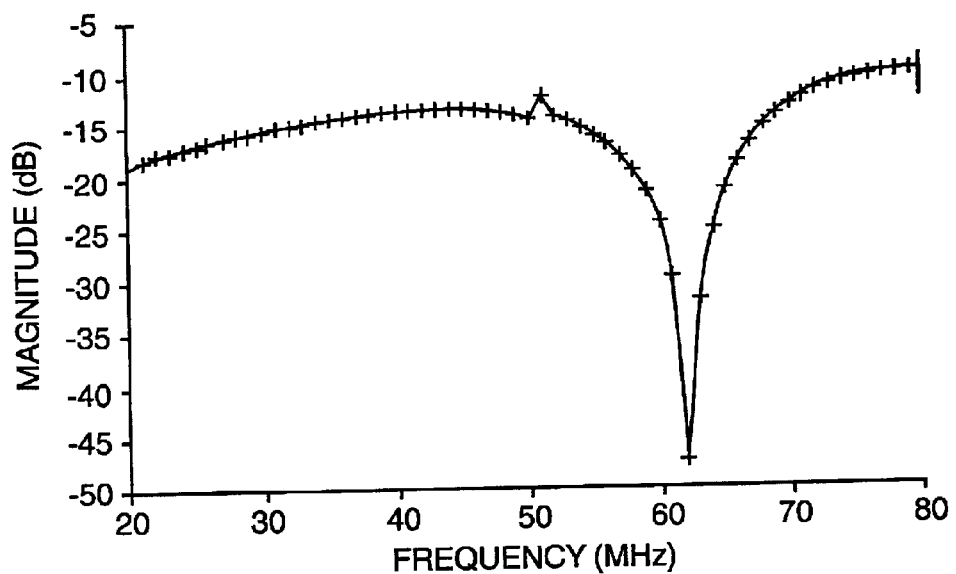
FIG. 6 is a graphical representation of the simulation results of an S21 measurement of the near field planar strip antenna of FIGS. 3A–C.

A PSA antenna 100 having conductor strips 140 with such lengths, yields an array of conductor strips in which there is a significant reduction in signal coupling between adjacent conductor strips 140a,b in a narrow frequency band, for example, a frequency band about the NMR resonance frequency. Such a significant reduction is established regardless of the spacing "s" between adjacent conductor strips 140a,b, the width ("w") of the conductor strips, or the thickness of the conductor strips. More specifically, the reduction in signal coupling is so significantly reduced over the narrow frequency band, as graphical illustrated in FIG. 6, that the adjacent conductor strips 140a,b are in effect de-coupled from each other. FIG. 6 illustrates the simulation results of S21, by inserting dimensions of a PSA antenna 100c according to the present invention into a 3D EM field analysis software (Sonnet Lite, Liverpool, N.Y.) where the PSA antenna was configured so a standing wave is on each conductor strip 140.

PSA Structure Analysis

The following is an analysis of the structure comprising a PSA antenna 100a–c of any of the above-described embodiments. Because the electromagnetic field on each conductor strip 140 is a quasi-transverse electromagnetic wave (TEM), each conductor strip can be treated as a transmission line and the ABCD matrix for the array is defined by:

$$\begin{bmatrix} A & B \\ C & D \end{bmatrix} = \begin{bmatrix} \cosh\gamma l & Z_0\sinh\gamma l \\ \frac{\sinh\gamma l}{Z_0} & \cosh\gamma l \end{bmatrix} \xrightarrow{lossless} \begin{bmatrix} \cos\beta l & jZ_0\sin\beta l \\ j\frac{\sin\beta l}{Z_0} & \cos\beta l \end{bmatrix} \quad [1]$$

Where $\lambda$ is the propagation constant and $\gamma=\alpha+j\beta$, where $\alpha$ is the attenuation constant and $\beta$ is the phase constant.

The normalized input impedance of each conductor strip 140 is defined by:

$$\overline{Z} = \frac{Z}{Z_0} = \frac{\overline{A}\overline{Z}_L + \overline{B}}{\overline{C}\overline{Z}_L + \overline{D}}, \quad [2]$$

Where Z is the input impedance, $Z_L$ is the impedance of the load on the termination end of each conductor strip 140, $\overline{Z}_L = Z_L/Z_O$, $\overline{A}=A$, $\overline{B}=B/Z_O$, $\overline{C}=C\,Z_O$, $\overline{D}=D$ The input reflection coefficient ($\Gamma$) of each conductor strip 140 is defined by:

$$\Gamma = \frac{\overline{Z}-1}{\overline{Z}+1} = \frac{\overline{A}\overline{Z}_L + \overline{B} - \overline{C}\overline{Z}_L - \overline{D}}{\overline{A}\overline{Z}_L + \overline{B} + \overline{C}\overline{Z}_L + \overline{D}}. \quad [3]$$

The coupling between any two conductor strips 140a,b cab be analyzed using the even-odd mode theory. At the feeding point of each conductor strip 140, let $\Gamma_e$ and $\Gamma_o$ be the even and odd mode input reflection coefficients respectively of the conductor strips 140, and $\Gamma_G$ is the output reflection coefficient of the receiver channel at the feeding point. Then the coupling coefficient (k) is defined by:

$$k = \frac{1}{2}\frac{\Gamma_e - \Gamma_o}{1 - \Gamma_G(\Gamma_e + \Gamma_o)}. \quad [4]$$

Unlike a conventional MR phased array antenna, the conductor strips 140 of a PSA antenna according to the present invention are de-coupled by the EMF cancellation when the lengths of the conductor strips and their terminations are arranged in the desired fashion. The PSA antennas of the present invention are categorized into two types for purposes of analysis and design: a standing wave type and a traveling wave type.

Standing Wave Type

For a standing wave type PSA antenna, its termination is configured as one of an open or short. The standing wave caused by the high reflection set as either is of the short or open termination, can about double the signal voltage and about quadruple the signal power. Consequently, there is a good signal to noise ratio (SNR) for such an arrangement. In addition, and as explained below, the coupling among the conductor strips 140 of a standing wave type PSA antenna vanishes for the above described conductor strip lengths regardless of the spacing of the conductor strips.

The coupling between any two conductor strips 140a,b can be derived using the above equations (1)–(4). In the case where a conductor strip 140a is terminated by a short (i.e., $Z_L=0$) and assuming the attenuation is trivial (i.e., $\alpha=0$) then the coupling coefficient is defined by:

$$k = \frac{j(\overline{Z}_{0e} - \overline{Z}_{0o})\sin 2\beta l}{2(\cos^2\beta l - \overline{Z}_{0o}\overline{Z}_{0e}\sin^2\beta l) + j(\overline{Z}_{0o} + \overline{Z}_{0e})\sin 2\beta l + 2\Gamma_G(\overline{Z}_{0o}\overline{Z}_{0e}\sin^2\beta l + \cos^2\beta l)}, \quad [5]$$

Where $\overline{Z}_{Oe}$ and $\overline{Z}_{Oo}$, are respectively the normalized even and odd mode input impedance of the conductor strip 140. When a conductor strip 140 is terminated with an open (i.e., $\overline{Z}_L \to \infty$) then the then the coupling coefficient is defined by:

$$k = \frac{j\left(\frac{1}{\overline{Z}_{0o}} - \frac{1}{\overline{Z}_{0e}}\right)\sin 2\beta l}{2\left(\cos^2\beta l - \frac{\sin^2\beta l}{\overline{Z}_{0o}\overline{Z}_{0e}}\right) + j\left(\frac{1}{\overline{Z}_{0o}} + \frac{1}{\overline{Z}_{0e}}\right)\sin 2\beta l - 2\Gamma_G\left(\frac{\sin^2\beta l}{\overline{Z}_{0o}\overline{Z}_{0e}} + \cos^2\beta l\right)}. \quad [6]$$

From either of these equations it is realized that when the length (l) of the conductor strip is about $\lambda/4$ the coupling coefficient equals zero.

Traveling Wave Type

For a traveling wave type PSA antenna, its termination is configured so as to be matched with the load (i.e., $Z_L=1$). As explained below, the coupling among the conductor strips 140 of a traveling wave type PSA antenna vanishes for the above described conductor strip lengths regardless of the spacing of the conductor strips.

The coupling between any two conductor strips 140a,b can be derived using the above equations (1)–(4). In the case where the conductor strip terminations are matched load and assuming the attenuation is trivial (i.e., $\alpha=0$) then the coupling coefficient is defined by:

$$k = \frac{j(\overline{Z}_{0e} - \overline{Z}_{0o})\sin\beta l}{2\cos\beta l + j(\overline{Z}_{0o} + \overline{Z}_{0e})\sin\beta l}. \quad [7]$$

From this equation it is realized that when the length (l) of the conductor strip is about $\lambda/2$ the coupling coefficient equals zero.

In another aspect of the present invention, a PSA antenna 100 is configured and arranged so as to provide broadband de-coupling using the ground plane 110. Such de-coupling is not related to the length (l) of the conductor strips 140, rather it is related or dependent upon the transverse dimensions s, the spacing between conductor strips, and h, the height or overall thickness of the encapsulating member comprising the substrate 120 and the overlay 130 (i.e., h=thickness of substrate+thickness of overlay).

The analytical characterization of such de-coupling is expressed by $Z_{Oe}=Z_{Oo}$. Based on this analytical characterization, this condition $Z_{Oe}=Z_{Oo}$ is further expressed for a conductor strip pair by the following:

$$1 + \tanh\left(\frac{\pi}{2}\frac{s}{h}\right) = \frac{\left(1 + \coth\left(\frac{\pi}{2}\frac{s}{h}\right)\right)^2}{2}. \quad [8]$$

Figure 7:
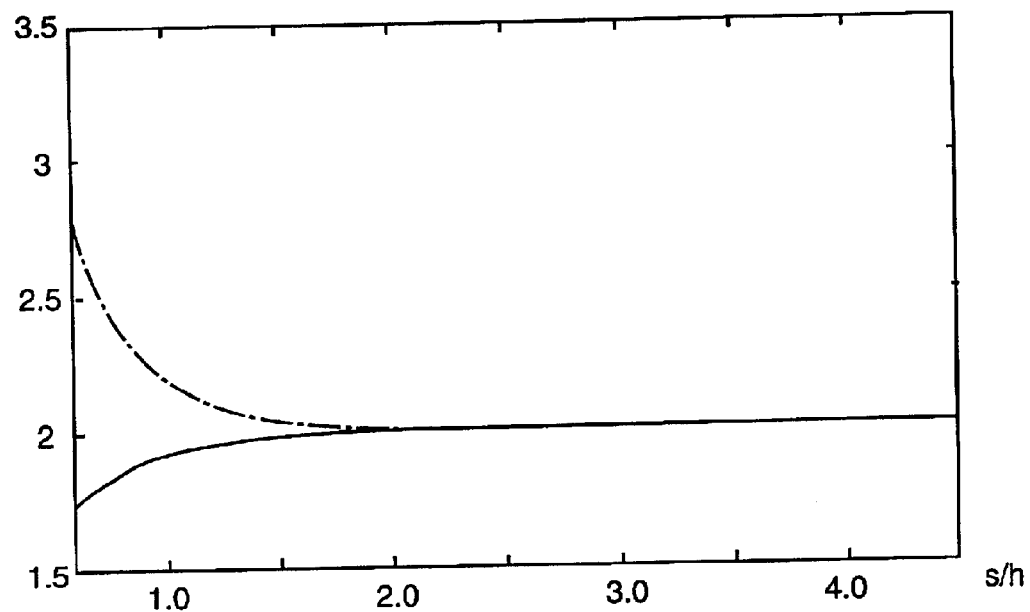
FIG. 7 is a graphical solution of the $Z_{Oe}=Z_{Oo}$ analytic expression.

There is shown in FIG. 7, a graphic solution to both sides of this equation. Therein it is shown that when the ratio of the strip spacing to the height of the encapsulating member is about 2.5 or greater (i.e., s/h≧about 2.5), there is de-coupling of the adjacent conductor strips 140a,b ($Z_e \approx Z_o$). It also is seen that when this ratio is about 3 or greater (i.e., s/h≧about 3) the even and odd mode impedance are equal, such that the two adjacent conductor strips 140 are essentially de-coupled from each other irrespective of the strip length (1).

Figure 8A:
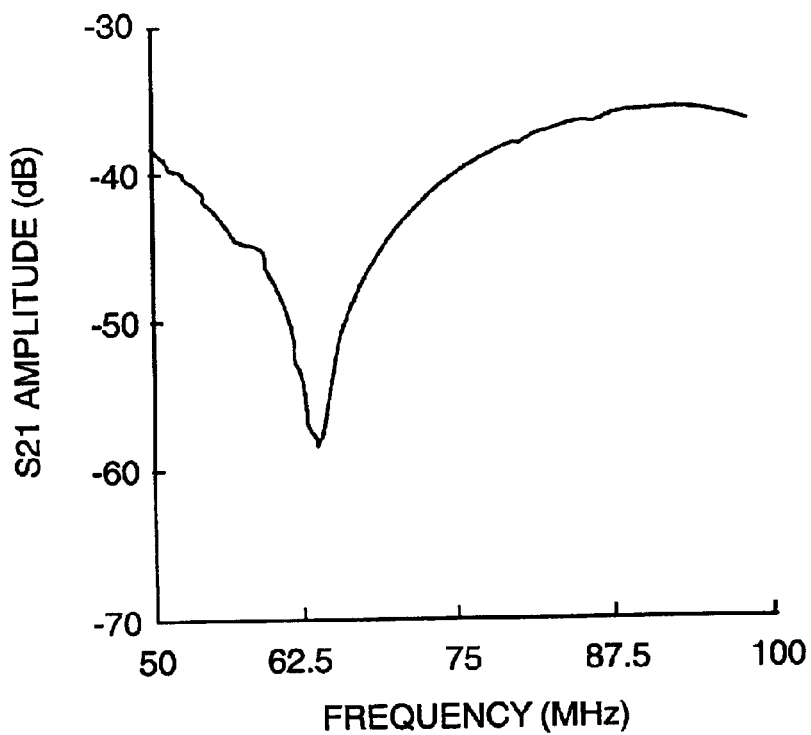
FIG. 8A is an S21 measurement for a standing wave type of near field planar strip antenna when loaded.
Figure 8B:
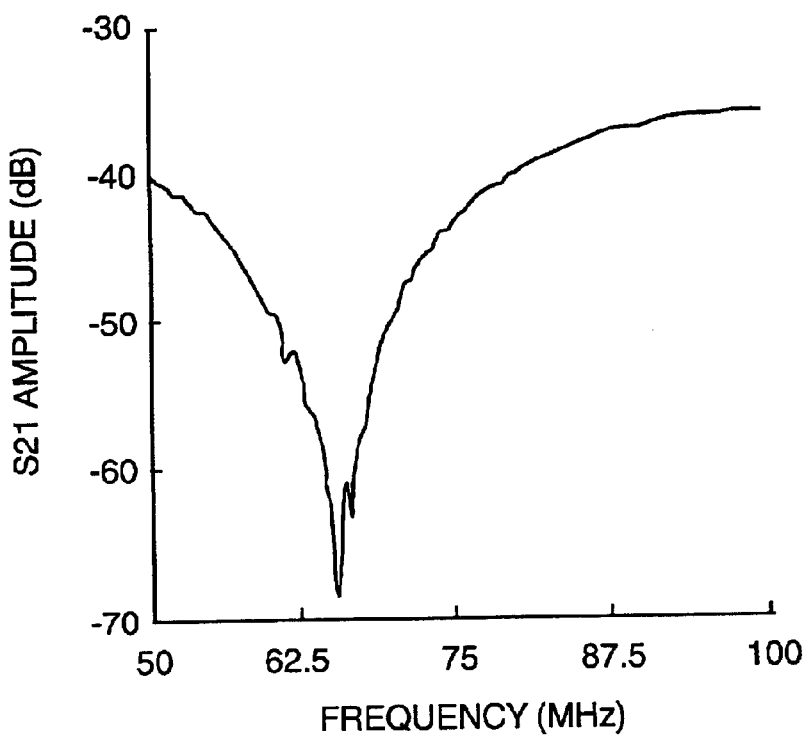
FIG. 8B is an S21 measurement for an unloaded, traveling wave type of near field planar strip antenna.

The analytical performance of a PSA antenna according to the present invention was confirmed by measuring S-parameters on the network analyzer, such as an HP 8722D and a HP4195A, and an MRI scanner such as a SIGNA & LX 1.5T as manufactured by General Electric Corporation. There is shown in FIG. 8A an S21 measurement for a standing wave type of near field planar strip antenna when the pair of conductor strips 140 are loaded. In the illustrated embodiment, the conductor strips 140 had a length (1) equal to $\lambda/4$ and the ratio of s/h was 2.5 or greater. There also is shown in FIG. 8B an S21 measurement for an unloaded, traveling wave type of near field planar strip antenna having the same s/h ratio as for the standing wave case and a length equal to $\lambda/2$. These figures both show that the PSA antenna 100c exhibits both broadband de-coupling and narrow band de-coupling. It is shown graphically that when $Z_e \approx Z_o$ there is a broadband de-coupling of about –30 dB. At the resonance frequency, it is shown that an additional de-coupling of about –30 dB, providing a total de-coupling of about –60 dB.

Figure 9A:
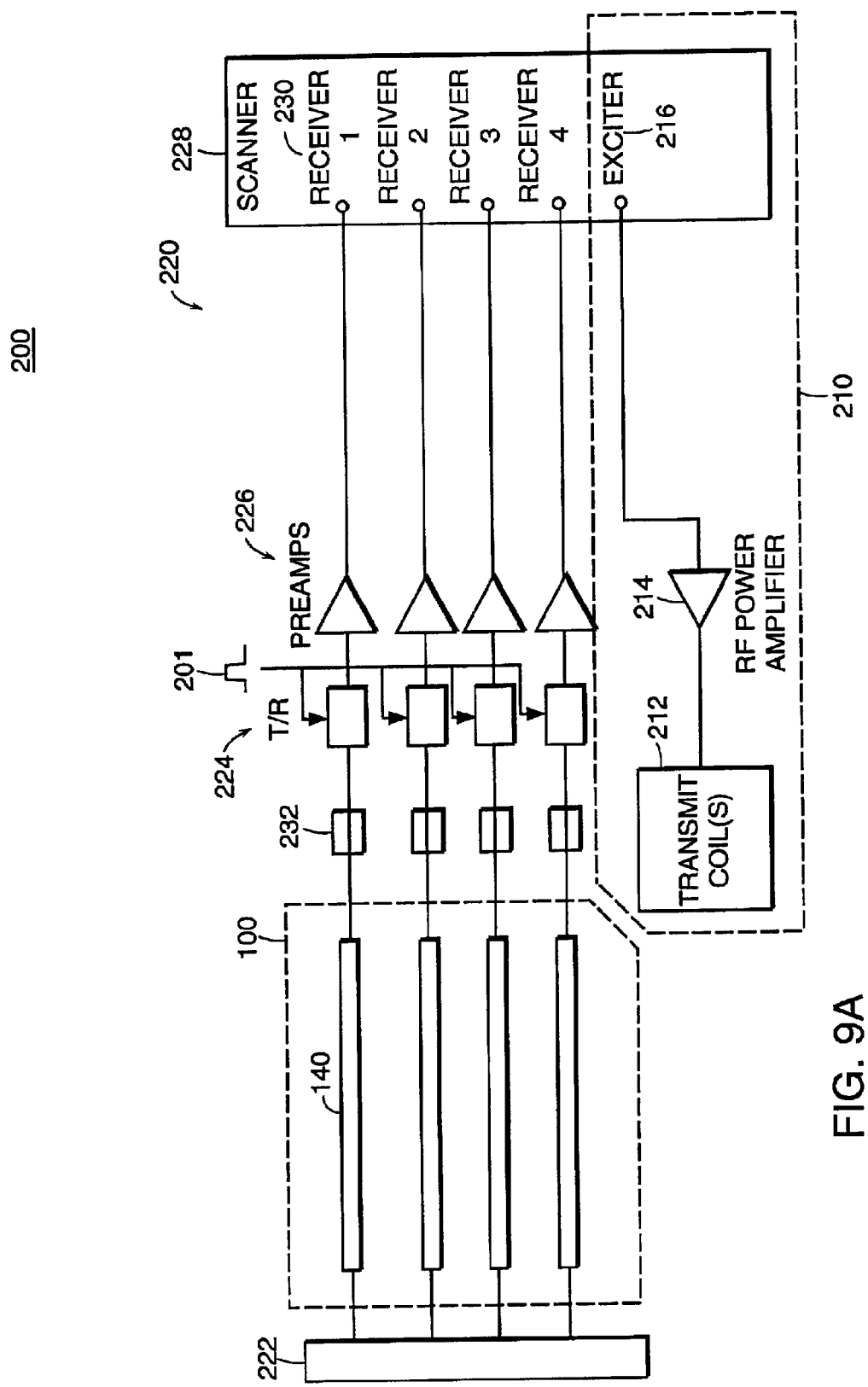
FIG. 9A is a schematic view of an exemplary RF excitation and MR signal detection sub-system of an MRI system for detecting MR signals of excited hydrogen nuclei.

Now referring to FIG. 9A, there is shown a schematic view of an exemplary RF excitation and MR signal detection apparatus 200, or sub-system of an MRI system, for detecting MR signals of excited hydrogen nuclei, including an RF excitation portion 210 and an MR signal detection portion 220. The RF excitation portion 210 includes transmitter coil(s) 212, a power amplifier 214 and an exciter 216. The transmitter coil(s) 212 are any of a number of transmitter coil designs, arrangement and/or configuration known to those skilled in the art. In an illustrative embodiment, the transmitter coils are single-turn 40 cm square surface coils that are laid flat on the scanner bed with its center approximately coplanar with the long axes of the conductor strips 140 comprising the PSA antenna 100. The power amplifier 214 is any of a number of power amplifiers known to those skilled in the art for amplifying the RF signal being outputted via the transmitter coils 212 to excite the nuclei with the section being scanned of the patient or the object to be scanned. The exciter 216, as is known to those skilled in the art, is a system board that generates the RF waveform that is feed into the power amplifier.

The MR signal detection portion 220 includes a PSA antenna 100 according to the present invention, a plurality of terminations 222 one for each conductor strip 140, a plurality of transmit/receive switches 224 one for each conductor strip, a plurality of preamplifiers 226 and a scanner 228 including a plurality of receivers 230. Although the PSA antenna illustrated corresponds to that in FIGS. 1A–C, this is not a limitation as any PSA antenna according to the teachings of the present invention including any of the above-described PSA antenna embodiments can be used with the MR signal detection portion 220. Reference also should be made to the foregoing discussions regarding FIGS. 1–8 for components or any details or information not otherwise provided hereinafter.

The transmit/receive (T/R) switches 224 are any of a number of devices known to those skilled in the art that selectively couple and de-couple each conductor strip 140 from the corresponding preamplifier 226. Such de-coupling and coupling is responsive to a signal 201 provided to each of the T/R switches 224. In MRI applications, de-coupling is typically done during the time period when the RF excitation portion 210 is to output the RF excitation signals and such coupling is effected when RF excitation signals are not being generated, more particularly during the time period when MR signals are to be detected. In an illustrative embodiment, the T/R switch 224 is in the form of a diode that is configured and arranged so that it receives a forward bias such that the diode becomes a short circuit when transmitting or outputting the RF excitation signals.

The preamplifiers 226 are any of a number of devices or preamplifiers known to those skilled in the art, that amplify the MR signal detected on each of the conductor strips 140 to a level such that the scanner receiver can receive and process the inputted signal(s). In an illustrative embodiment, the preamplifiers 224 are Signa 1.5T preamplifiers as manufactured by General Electric Corporation.

The scanner receivers 230 are any of a number of devices known to those skilled in the art that can receive an RF signal at the desired frequency. Such a scanner receiver 230 also includes the capability of down-converting the received RF signal into a lower frequency signal. In a more particular embodiment, the scanner receiver 230 further includes an analog to digital (A/D) converter as is known in the art that converts the analog lower frequency signal into a digital signal. Using known techniques the digital signal is converted to quadrature (I and Q), where the complex sign is sent to memory. In an illustrative embodiment, the scanner receiver is any one of a number of such receivers manufactured by General Electric Corporation, for example, the narrowband receiver in the Transceiver Processing Storage (TSP) cabinet of a SIGNA scanner as manufactured by the General Electric Corporation.

The terminal end of each conductor strip 140 is electrically interconnected to circuitry comprising the termination 222. For a standing wave type of PSA antenna, the circuitry of the termination 222 is configured and arranged such that the terminal end is one of an open circuit or a short circuit. In the case of the traveling wave type of PSA antenna, the termination 222 includes circuitry that is a resistive match to the impedance of the conductor strip. In an illustrative embodiment, the width, spacing and height of the encapsulation are selected such that the characteristic impedance (i.e., $Z_O$) of the conductor strip 140 is about 50 ohms. In this case, the circuitry of the termination 222 would be configured so that the terminal end of each conductor cable has matching impedance. It is within the skill of those knowledgeable in the art to provide the foregoing described circuitry of/comprising the termination 222.

The feed point of each conductor strip 140 is electrically connected to a corresponding one of the preamplifiers such that the MR signal (s) detected by the conductor strip is communicated or transmitted to the preamplifier and thence onto the corresponding one of the receivers 230. The electrical interconnection between the conductor strip 140 and the corresponding preamplifier 226 can further included circuitry 232 to couple the detected MR signal out of the conductor strip and to the receiver 230 with minimum losses. For a traveling wave type of PSA antenna such coupling out circuitry is typically not required because the termination and input impedance at the feeding point are typically about the same.

Because of the open or short circuit termination of the conductor strip 140, the direct coupling of the detected MR signal from the conductor strip to a corresponding preamplifier 224 is inefficient. Thus, the circuitry 232 provided in the electrical interconnection from the feed point of the conductor strip 140, includes for example circuitry in the form of a reactive device that is configured or arranged to couple the signal to the preamplifier 226. More specifically, the circuitry 232 for coupling out the detected MR signal comprises one of series capacitor or a shunt inductor for respectively one of a short or open termination of the conductor strips.

Also, because the input impedance at the feeding point is either close to zero (for an open termination) or very large (for a short termination), it is desirable to further match of the network. Such matching can be accomplished using any of a number of techniques known to those skilled in the art, while taking the following considerations into account. Firstly, the matching network should be configured and arranged such that $\Gamma_G$, the output reflection coefficient of the receiver channel at the feeding point, is not in the region of ½ in the case of a short termination or −½ in the case of an open termination. This is done so as to assure that the narrow band de-coupling effect is not destroyed. In the case where the impedance at the feeding point is close to zero, the matching network should be configured or arranged such that $\Gamma_G$ is made close to zero. In this way, suppression of the standing wave is avoided. Finally, when the selection of using capacitors or inductors, and series and shunts, should be done in a manner such as to satisfy the one of the following relations.

When the termination is a short circuit, then the ratio of the energy stored in the conductor strip 140 to the total energy losses on the strips, external circuits, imaging objects loading and cables ("$Q_L$") is defined as follows.

$$Q_L = \frac{Z_0(\overline{X}_c + \beta l(1 + \overline{X}_c^2))}{Z_0(\overline{X}_c + \beta l(1 + \overline{X}_c^2))\tan\delta + 2R_E}. \quad [9]$$

Similarly, when the termination is an open circuit, then the ratio of the energy stored in the conductor strip 140 to the total energy losses on the strips, external circuits, imaging objects loading and cables ("$Q_L$") is defined as follows.

$$Q_L = \frac{R_E(\overline{B}_L + \beta l(1 + \overline{B}_L^2))}{R_E(\overline{B}_L + \beta l(1 + \overline{B}_L^2))\tan\delta + 2Z_0}. \quad [10]$$

Where $R_E$ is the external resistance including input impedance of the preamplifier, cable loss and the load of the imaging objects; $B_L$ is the susceptance of the coupling lump element device; $X_C$ is the reactance of the coupling lump element device and $\tan \delta$ is the loss tangent of the dielectric medium.

Figure 9B:
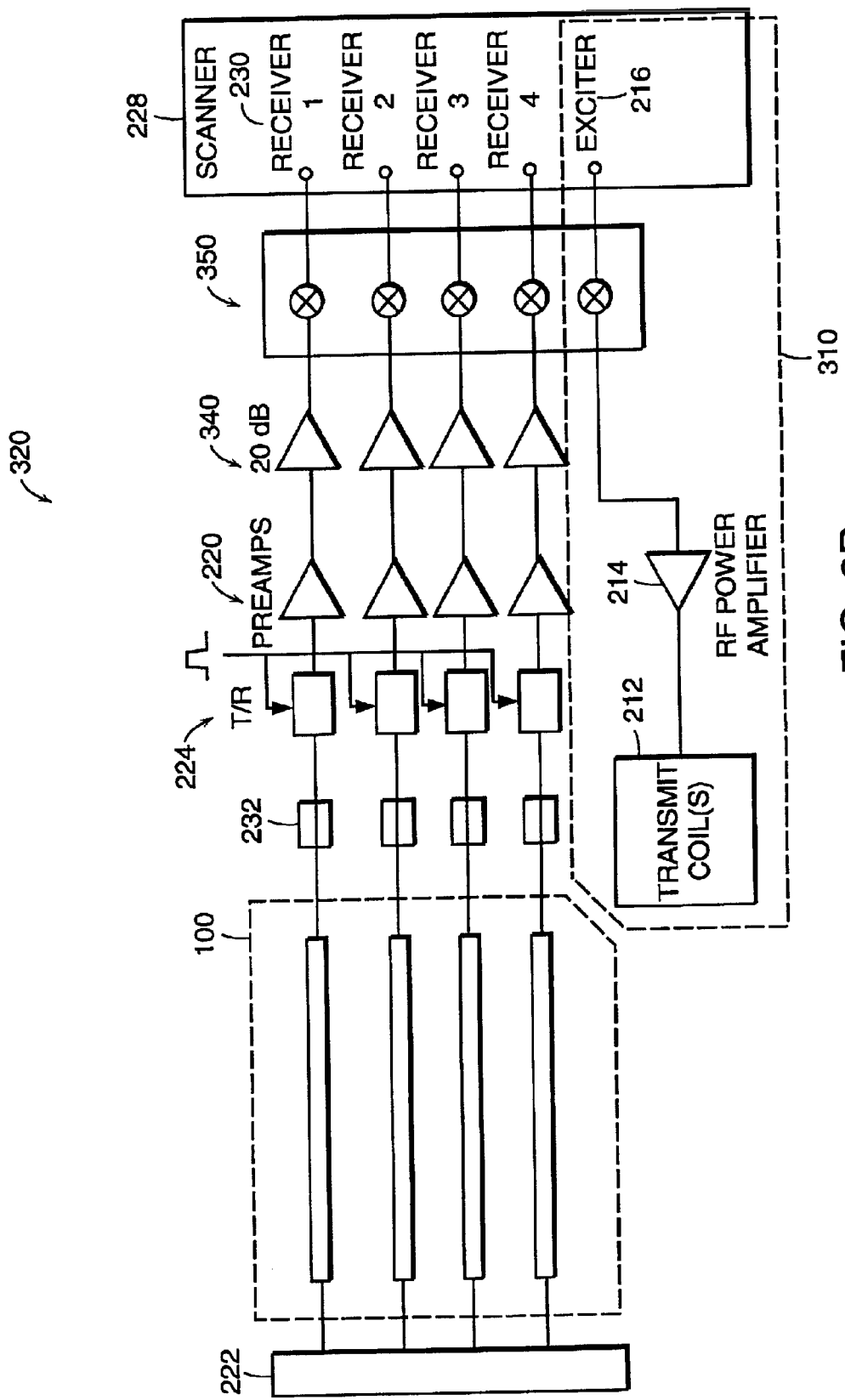
FIG. 9B is a schematic view of another exemplary RF excitation and MR signal detection sub-system of an MRI system for detecting MR signals of other excited nuclei such as sodium.
Figure 10B:
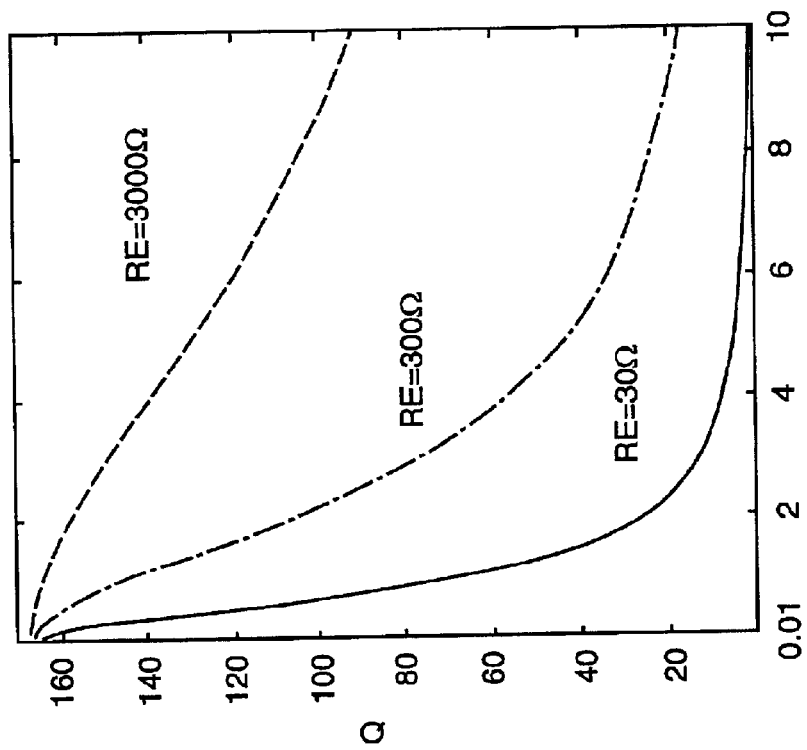
FIGS. 10A,B are graphical views illustrating the effect of the reactive coupling element or circuitry on the Q of the conductor strips.
Figure 10A:
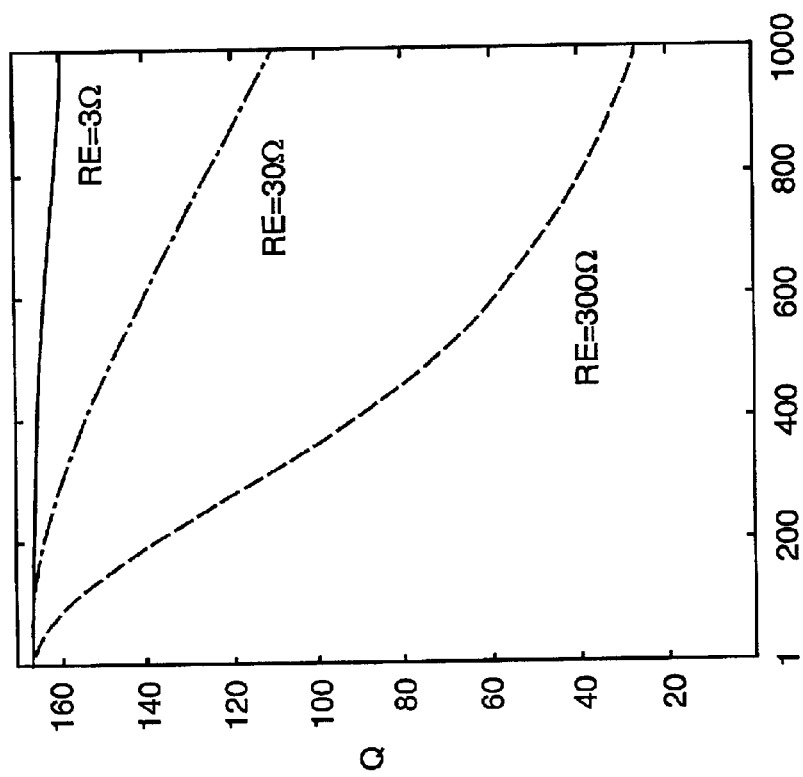

The behavior of $Q_L$ in these equations, or a demonstration of how the reactive coupling element or circuitry 232 can effect the Q of the strips for a given load resistance, is shown in FIGS. 10A,B. Where FIG. 10A illustrates the behavior when using a series capacitor to couple the signal to a receiver 230 when the termination is a short and FIG. 10B illustrates the behavior when using a shunt inductor to couple the signal to the receiver when the termination is an open circuit. Now referring to FIG. 9B, there is shown a schematic view of an exemplary RF excitation and MR signal detection apparatus 300, or sub-system of an MRI system, for detecting MR signals of other excited nuclei such as sodium. The RF excitation and MR signal detection apparatus 300 more particularly includes an RF excitation portion 310 and an MR signal detection portion 320. The RF excitation portion 310 includes transmitter coil(s) 212, a power amplifier 214 and an exciter 216, however, the RF excitation portion also is configured or arranged so as to output an RF signal at the appropriate resonance frequency for the nuclei to be excited. Reference shall be made to the foregoing discussion for FIG. 9A for other details regarding the components comprising the RF excitation portion 310.

The MR signal detection portion 320 includes a PSA antenna 100 according to the present invention, a plurality of terminations 222 one for each conductor strip 140, a plurality of transmit/receive switches 224 one for each conductor strip, a plurality of preamplifiers 226, a plurality of second amplifiers 340, a frequency converter 350 and a scanner 228 including a plurality of receivers 230. Reference should be made to the foregoing discussions regarding FIGS. 1–8 and 9A for components or any details or information not otherwise provided hereinafter.

Typically the MR signals being detected from such other nuclei are weaker than the MR signals from excited hydrogen nuclei. As such, the MR signal detection portion 320 of this embodiment includes a plurality of second amplifiers 340 that further amplify the signal output from the plurality of preamplifiers. These second amplifiers 340 are any of a number of devices or amplifiers known to those skilled in the art, that amplify the signal outputs from the preamplifiers 226 to a level such that the scanner receiver 230 can receive and process the inputted signal(s). In an illustrative embodiment, each of the plurality of second amplifiers 340 is a 20 dB gain broadband amplifier such as those used for broadband spectroscopy on a SIGNA scanner as manufactured by General Electric Corporation.

Typically the MR signals being detected from such other nuclei have a different resonance frequency than that for excited hydrogen nuclei and the receivers 230 for receiving the MR signals are typically tuned to the resonance frequency for excited hydrogen nuclei. As such, the MR signal detection portion 320 of this embodiment includes a frequency converter 350 as is known to those skilled in the art that converts the signals having the resonance frequency of the other nuclei to the resonance frequency for excited hydrogen nuclei so these signals can be received by the plurality of receivers 230. In an illustrative embodiment, the frequency converter 350 is a broadband mixing unit which itself is an assemblage of discrete amplifier, mixer and filter components available from MiniCircuits Inc. (MO USA). Alternatively, the scanner 228 can be configured with a plurality of receivers tuned to the resonance frequency of the other nuclei such that the frequency converter can be dispensed with.

Figure 11:
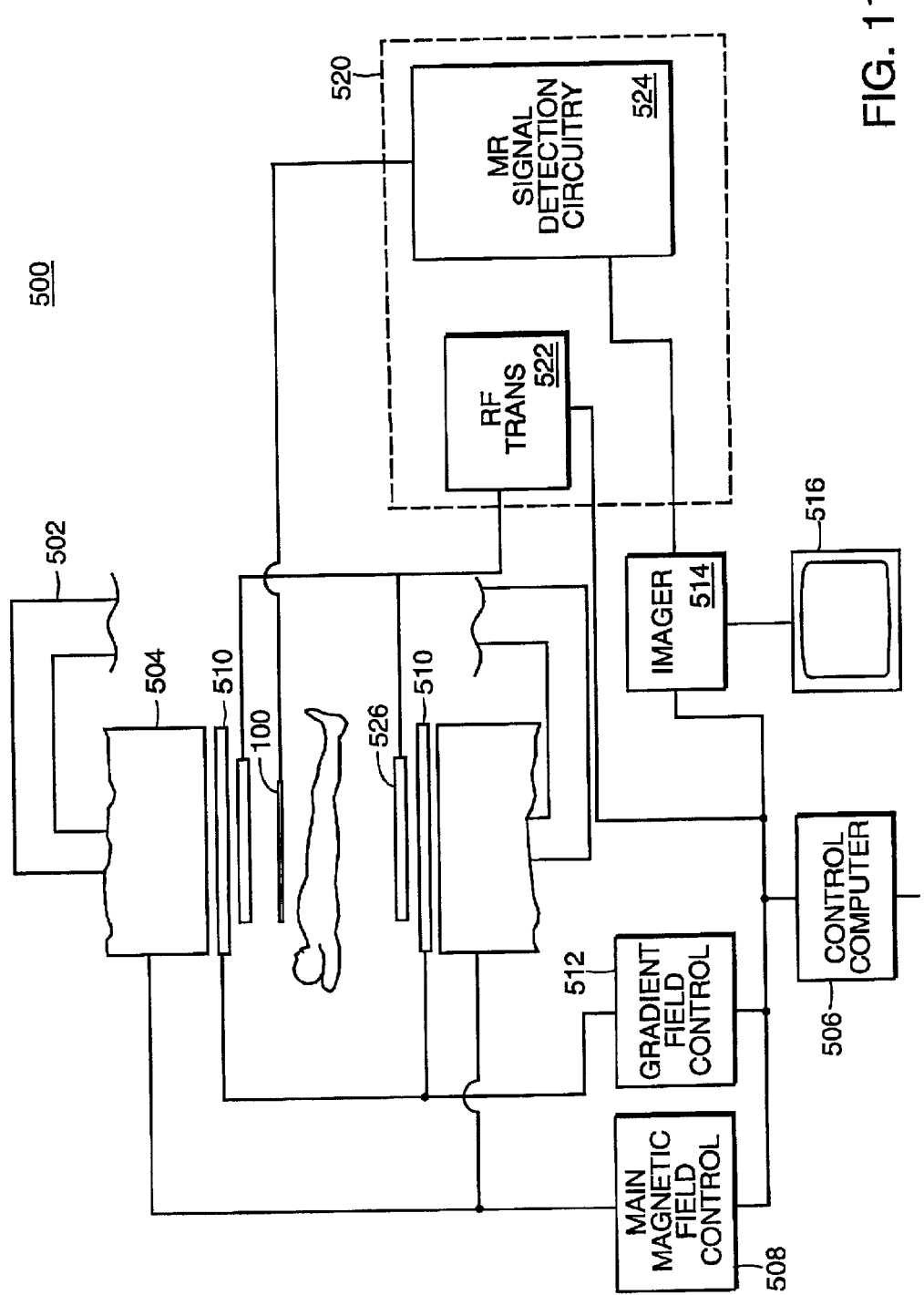
FIG. 11 is a schematic view of an exemplary magnetic resonance imaging (MRI) system having an RF excitation and MR signal detection apparatus according to the present invention.

Referring now to FIG. 11 there is shown a schematic view of an exemplary magnetic resonance imaging (MRI) system 500 having a RF excitation and MR signal detection apparatus according to the present invention. Although the RF excitation and MR signal detection apparatus 200 of FIG. 9A is referred to in the illustrated embodiment, this shall not comprise a limitation and other RF excitation and MR signal detection apparatuses in accordance with the teachings of the present invention are contemplated for use in such an MRI system. Additionally, although a MRI system having main magnet comprising a C-type magnet is illustrated, this also shall not constitute a limitation as it is with the contemplated scope of the present invention to adapt any of a number of known MRI system so as to be capable of using the RF excitation and MR signal detection apparatus of the present invention.

The MRI system 500 includes an electromagnetic 502, a computer 506, a main magnetic field control 508, a gradient coil sub-system 510, a gradient field control 512, an imager 514, a display device 516 and a RF excitation and MR signal detection apparatus 520 according to the present invention.

The electromagnet produces a strong main magnetic field Bo across a gap between pole pieces 504 of the electromagnet. In use of the MRI system a body 2 to be imaged, for example a patient, is placed in the gap between the pole pieces 504 on a suitable support (not shown). The strength of the electromagnetic field in the gap between the pole pieces 504, and hence in the body 2, is controlled by a computer 506 via a main magnetic field control 508, which controls the supply of energizing current to the electromagnet energizing coil.

The gradient coil sub-system 510, comprising one or more gradient coils, whereby a magnetic gradient can be imposed on the static magnetic field in the gap between the poles pieces 504 in any one or more of three orthogonal directions X, Y, and Z. The gradient coil sub-system 510 is energized by a gradient field control 512 that also is under the control of the computer.

The RF excitation and MR signal detection apparatus 520 according to the present invention includes an RF transmitter 522, MR signal detection circuitry 524, transmitter coils 526 and a PSA antenna 100 according to the present invention. The RF transmitter 522 is under the control of the computer 506 so that RF field pulses or signals are selectively generate and applied to the body 2 for excitation of magnetic resonance in the body. While these RF excitation pulses are being applied to the body T/R switches 224 (FIG. 9A) of the MR signal detection circuitry are actuated so as to de-couple the PSA antenna 100 from the MR signal detection circuitry.

Following application of the RF excitation pulses, the T/R switches are again actuated to couple the PSA antenna 100 to the MR signal detection circuitry 524. The PSA antenna 100 detects or senses the MR signals resulting from the excited nuclei in the body and passes the MR signals onto the MR signal detection circuitry 524 (e.g., the receivers 230 thereof. These detected MR signals are in turn passed onto the imager 514. The imager 514, under the control of the computer 506, processes the signals to produce signals representative an image of the body 2. These processed signals are sent onto a display device 516 to provide a visual display of the image. In operation, the uniform magnetic field $B_o$ generated by the main or primary magnet(s) 502 is applied to the body 2 by convention along the Z-axis of a Cartesian coordinate system, the origin of which is within the imaged object. The uniform magnetic field $B_o$ being applied has the effect of aligning the nuclear spins, a quantum mechanical property of macroscopic particles comprising the body 2, along the Z-axis. In response to RF pulses of the proper frequency being generated by the RF transmitter 522, that are orientated within the XY plane, the nuclei resonate at their Larmor frequencies. In a typical imaging sequence, the RF signal centered about the desired Larmor frequency is applied to the body 2 at the same time a magnetic field gradient $G_z$ is being applied along the Z-axis by means of the gradient control sub-system 510. This gradient field $G_z$ causes only the nuclei in a slice with a limited width through the body 2 along the XY plane, to have the resonant frequency and to be excited into resonance.

After excitation of the nuclei in the slice, magnetic field gradients are applied along the X- and Y-axes respectively. The gradient $G_X$ along the X-axis causes the nuclei to precess at different frequencies depending on their position along the X-axis, that is, $G_x$ spatially encodes the precessing nuclei by frequency (i.e., frequency encoding). The Y-axis gradient $G_y$ is incremented through a series of values and encodes the Y position into the rate of change of the phase of the precessing nuclei as a function of gradient amplitude, a process typically referred to as phase encoding.

Using any of a number of serial or parallel encoding techniques, the encoded position information is used to create the image. Because the PSA antenna 100 of the present invention can utilize deploy large numbers of conductor strips 140, the decimation factor in parallel encoded techniques is not limited in number as with prior art techniques and phased arrays systems. Accordingly, the time taken to create the complete image of the body 2 is significantly reduced as compared to such prior art systems. The PSA antenna 100 of the present invention, however, accomplishes this without degrading the capability of performing a conventional serial encoding process to acquire an image.

Although a preferred embodiment of the invention has been described using specific terms, such description is for illustrative purposes only, and it is to be understood that changes and variations may be made without departing from the spirit or scope of the following claims.

What is claimed is:

1. A device for detecting magnetic resonance signals, comprising a strip array antenna, wherein the strip array antenna includes: a plurality of conductors arranged so a long axis of each is in parallel and spaced from each other, each conductor forming an independent detector element of the strip antenna; and a ground plane that is arranged so that each of the plurality of conductors is spaced from one side of the ground plane; and wherein a length of each conductor is set so as to substantially reduce coupling of a magnetic resonance signal in one of the plurality of conductors to an adjacent conductor(s) independent of the spacing between adjacent conductors.

2. The detection device of claim 1, wherein the length of each conductor is set so as to be equal to be about nλ4, where n is an integer $\geq 1$ and λ is the wavelength of the signal to be detected.

3. The detection device of claim 2, wherein the lengths of the plurality of conductors is the same.

4. The detection device of claim 1, wherein a number of parallel conductors comprising the strip array antenna is one of 4 or more conductors, 16 or more conductors, or 32 or more conductors.

5. The detection device of claim 1, wherein a number of parallel conductors comprising the strip array antenna is in the range of one of the ranges of from about 4 to about 16 conductors, from about 4 to about 32 conductors or from about 16 to about 32 conductors.

6. The detection device of claim 1, further comprising an encapsulation member, wherein:
   the encapsulation member includes:
      a substrate, on one surface of which is disposed the plurality of conductors, and
      an overlay that covers the conductors disposed on the substrate; and the ground plane is disposed on an opposing side of the substrate.

7. The detection device of claim 6, wherein the substrate and the overlay are made of a material having a dielectric constant so the wavelength of the electromagnetic wave on the each conductor is reduced so as to be in a desired range.

8. The detection device of claim 7, wherein the dielectric constant of the substrate and overlay material is in the range of from about 6 to 9.6.

9. The detection device of claim 7, wherein the ground plane is configured to keep EMF on each conductor in a quasi-TEM mode.

10. The detection device of claim 1, wherein each of the conductors is terminated in a manner so that the electromagnetic wave on each of the conductors is one of a standing wave or a traveling wave.

11. The detection device of claim 10, further comprising a termination mechanism operably connected to one end of each conductor and configured so as to terminate each of said one end as one of a short or an open.

12. The detection device of claim 10, wherein one end of each conductor is terminated with a resistive match and wherein n is an even integer.

13. The detection device of claim 1, further comprising a signal guard mechanism being arranged so that the guard mechanism isolates at least a portion of the strip array antenna from external EMF interference.

14. The detection device of claim 13, wherein the guard mechanism comprises a plurality of guard elements, where a guard element is disposed in proximity to each end of the strip array antenna to isolate at least the ends of the strip array antenna.

15. The detection device of claim 13, wherein the guard mechanism comprises a plurality of guard elements, where a guard element is disposed along and in proximity to each side of the strip array antenna to isolate at least sides of the strip array antenna.

16. The detection device of claim 13, wherein the guard mechanism is disposed in proximity to each end of the strip array antenna and along and in proximity to each side of the strip array antenna to isolate ends and sides of the strip array antenna.

17. The detection device of claim 13, wherein the guard mechanism is electrically grounded.

18. The detection device of claim 1, wherein the strip array antenna further includes an encapsulation member in which is disposed the plurality of conductors and wherein a spacing (s) between adjacent conductors and a height (h) of the encapsulation member is set so a ratio s/h satisfies the relationship $s/h \geq 2.5$.

19. The detection device of claim 18, wherein the ratio s/h satisfies the relationship $s/h \geq$ about 3.

20. The detection device of claim 18, wherein the encapsulation member includes:
a substrate, on one surface of which is disposed the plurality of conductors, and
an overlay that covers the conductors disposed on the substrate; and
wherein the ground plane is disposed on a opposing surface of the substrate.

21. A device for detecting magnetic resonance signals, comprising a strip array antenna, wherein the strip array antenna includes: X conductors arranged so a long axis of each is in parallel and spaced from each other, where X is an integer$\geq 2$, each of the X conductor forming an independent detector element of the strip antenna; wherein a length of each conductor is set to be equal to be about $n\lambda/4$, where n is an integer$\geq 1$ and $\lambda$ is the wavelength of the signal to be detected, thereby reducing coupling of a magnetic resonance signal in one of the X conductors to an adjacent conductor(s) independent of the spacing between adjacent conductors; an encapsulation member, wherein the encapsulation member includes: a substrate, on one surface of which is disposed the X conductors, a ground plane that is disposed on an opposing surface of the substrate, an overlay that covers the X conductors disposed on the substrate, and wherein the substrate and the overlay are of a material having a dielectric constant so the wavelength of the electromagnetic wave on each conductor is reduced so as to be in a desired range; and wherein each of the X conductors is terminated in a manner so that electromagnetic wave on each of the conductors is one of a standing wave or traveling wave.

22. The detection device of claim 21, wherein X is one of 4 or more, 16 or more, or 32 or more.

23. The detection device of claim 21, wherein X is in the range of one of the ranges of from about 4 to about 16, from about 4 to about 32 or from about 16 to about 32.

24. The detection device of claim 21, wherein the dielectric constant of the substrate and overlay material is in the range of from about 6 to 9.6.

25. The detection device of claim 21, further comprising a termination mechanism operably connected to one end of each conductor and configured so as to terminate each of said one end as one of a short or an open.

26. The detection device of claim 21, wherein one end of each conductor is terminated with a resistive match and wherein n is an even integer.

27. The detection device of claim 21, further comprising a signal guard mechanism being arranged so that the guard mechanism isolates at least a portion of the strip array antenna from external EMF interference.

28. The detection device of claim 27, wherein the guard mechanism is disposed in proximity to each end of the strip array antenna and along and in proximity to each side of the strip array antenna to isolate ends and sides of the strip array antenna and wherein the guard mechanism is electrically grounded.

29. The detection device of claim 21, wherein a spacing (s) between adjacent conductors and a height (h) of the encapsulation member is set so a ratio s/h satisfies the relationship $s/h \geq 2.5$.

30. The detection device of claim 29, wherein the ratio s/h satisfies the relationship $s/h \geq$ about 3.

31. The detection device of claim 21, wherein the lengths of the X conductors is the same.

32. A magnetic resonance signals detection apparatus, comprising: a strip array antenna and Y receivers, where Y is an integer$\geq 1$; wherein the strip array antenna includes: X conductors arranged so a long axis of each is in parallel and spaced from each other, where X is an integer$\geq 2$ and where each of the X conductors forms an independent detector element of a strip array antenna, and a ground plane that is arranged so that each of the X conductors is spaced from one side of the ground plane, and wherein a length of each conductor is set so as to substantially reduce coupling of a magnetic resonance signal in one of the X conductors to an adjacent conductor(s) independent of the spacing between adjacent conductors, and wherein the Y receivers are operably coupled td the X conductors so as to receive output signals from the X conductors.

33. The detection apparatus of claim 32, wherein the length of each conductor is set so as to be equal to be about $n\lambda/4$, where n is an integer$\geq 1$ and $\lambda$ is the wavelength of the signal to be detected.

34. The detection apparatus of claim 32, further comprising Y switches, one for each receiver and being operably coupled thereto, where the Y switches are configured so as to decouple the Y receivers and X conductors when an excitation electromagnetic signal is being generated and to couple the Y receivers and X conductors when an excitation electromagnetic signal is not being generated.

35. The detection apparatus of claim 32, wherein X=Y.

36. The detection apparatus of claim 35, wherein X is one of 4 or more, 16 or more, or 32 or more.

37. The detection apparatus of claim 35, wherein X is in the range of one of the ranges of from about 4 to about 16, from about 4 to about 32 or from about 16 to about 32.

38. The detection apparatus of claim 32, further comprising a termination mechanism operably connected to one end of each conductor and configured so as to terminate each of said one end as one of a short or an open.

39. The detection apparatus of claim 32, wherein each conductor is terminated with a resistive match and wherein n is an even integer.

40. The detection apparatus of claim 32, wherein the strip array antenna further includes an encapsulation member in which is disposed the plurality of conductors and wherein a spacing (s) between adjacent conductors and a height (h) of the encapsulation member is set so a ratio s/h satisfies the relationship s/h≧2.5.

41. The detection apparatus device of claim 40, wherein the ratio s/h satisfies the relationship s/h≧ about 3.

42. The detection apparatus of claim 32, wherein Y equals 1, and the one receiver is configured so as to include a plurality or more of input channels and wherein each of the X conductors is operably coupled to a respective one of the plurality or more of input channels.

43. An MRI excitation and detection apparatus to scan a region of an object comprising:
 a near field electromagnetic signal detection apparatus positioned to detect MRI signals from the region being scanned;
 an excitation signal generation apparatus that generates and transmits electromagnetic signals at an excitation frequency into the region being scanned; and
 wherein the near field electromagnetic signal detection apparatus, comprises:
  a strip array antenna,
  Y receivers, where Y is an integer≧1,
  wherein the strip array antenna includes:
   X conductors arranged so a long axis of each is in parallel and spaced from each other, where X is an integer≧2 and where each of the X conductors form an independent detector element of the strip array antenna,
   ground plane that is arranged so that each of the X conductors is spaced from one side of the ground plane, and
   wherein a length of each conductor is set so as to substantially reduce coupling of a signal in one of the X conductors to an adjacent conductor(s) independent of the spacing between adjacent conductors, and
  wherein the Y receivers are operably coupled to the X conductors so as to receive output signals from the X conductors.

44. The MRI excitation and detection apparatus of claim 43 further comprising a control mechanism operably coupled to the near field electromagnetic signal detection apparatus and the excitation signal generation apparatus and configured so as to selectively control the transmission of signals by the excitation signal generation apparatus and the reception of MRI signals by the near field signal detection apparatus so that each occurs at predetermined times.

45. The MRI excitation and detection apparatus of claim 43, wherein X=Y.

46. The MRI excitation and detection apparatus of claim 43, wherein Y equals 1 and the one receiver is configured so as to include a plurality or more of input channels and wherein each of the X conductors is operably coupled to a respective one of the plurality or more of input channels.

47. An MR imaging system to scan a region of an object, comprising:
 a near field electromagnetic signal detection apparatus positioned to detect MRI signals from the region being scanned;
 an excitation signal generation apparatus that generates and transmits electromagnetic signals at an excitation frequency into the region being scanned;
 wherein the near field electromagnetic signal detection apparatus, comprises:
  a strip array antenna,
  Y receivers, where Y is an integer≧2,
  wherein the strip array antenna includes:
   X conductors arranged so a long axis of each is in parallel and spaced from each other, where X is an integer≧2 and where each of the X conductors forms an independent detector element of the strip array antenna,
   a ground plane that is arranged so that each of the X conductors is spaced from one side of the ground plane, and
   wherein a length of each conductor is set so as to substantially reduce coupling of a signal in one of the X conductors to an adjacent conductor(s) independent of the spacing between adjacent conductors, and
  wherein the Y receivers are operably coupled to the X conductors so as to receive output signals from the X conductors; and
 an image reconstruction device, operably coupled to the near field electromagnetic signal detection apparatus that processes the detected MR signals and provides an output representative of the reconstructed image.

48. The MRI imaging system of claim 47 further comprising a control mechanism operably coupled to the near field electromagnetic signal detection apparatus and the excitation signal generation apparatus and configured so as to selectively control the transmission of signals by the excitation signal generation apparatus and the reception of MRI signals by the near field signal detection apparatus so that each occurs at predetermined times.

49. The MRI imaging system of claim 48 further comprising:
 a main magnetic coil that generates a homogenous magnetic in each slice;
 gradient coils that generate at least one additional magnetic field; and
 wherein the controller mechanism further controls the operation and energization of the main and gradient coils.

50. The MRI imaging system of claim 47, wherein X=Y.

51. The MRI imaging system of claim 47, wherein Y equals 1 and the one receiver is configured so as to include a plurality or more of input channels and wherein each of the X conductors is operably coupled to a respective one of the plurality or more of input channels.

52. A method for detecting magnetic resonance signals from a region, comprising the steps of: providing a a strip array antenna that includes: X conductors arranged so a long axis of each is in parallel and spaced from each other, where X is an integer≧2 and where each of the X conductors forms an independent detector element of a strip array antenna, and a ground plane that is arranged so that each of the X conductors is spaced from one side of the ground plane, and setting a length of each conductor to substantially reduce coupling of a magnetic resonance signal in one of the plurality of conductors to an adjacent conductor(s) independent of the spacing between adjacent conductors.

53. The method of claim 52, further comprising the step of positioning the strip array antenna so as to receive the electromagnetic signals from the region.

54. The method of claim 52, wherein said setting includes setting the length of each conductor so as to be equal to be about $n\lambda/4$, where n is an integer $\geq 1$ and $\lambda$ is the wavelength of the signal to be detected.

55. The method of claim 54, wherein said setting includes setting the length of each conductor so as to be the same.

56. The method of claim 54, further comprising the step of terminating each of the X conductors in a manner so that the electromagnetic wave on each of the conductors is one of a standing wave or a traveling wave.

57. The method of claim 56, wherein said terminating includes terminating one end of each conductor as one of a short or an open.

58. The method of claim 56, wherein said terminating includes terminating one end of each conductor with a resistive match and wherein n is set to be an even integer.

59. The method of claim 52, further comprising the step of isolating at least a portion of the provided strip array antenna from external EMF interference.

60. The method of claim 52, wherein the provided strip array antenna further includes an encapsulation member in which is disposed the X conductors having a height (h), wherein adjacent conductors are spaced from each other a distance (s) and wherein said method further includes:
   setting the height (h) and spacing distance (s) so that a ratio s/h satisfies the relationship $s/h \geq 2.5$.

61. The method of claim 60, wherein the ratio s/h satisfies the relationship $s/h \geq$ about 3.

62. The method of claim 60, wherein the provided encapsulation member includes:
   a substrate, on one surface of which is disposed the X conductors,
   an overlay that covers the conductors disposed on the substrate; and
   wherein the ground plane is disposed on an opposing surface of the substrate.

* * * * *

UNITED STATES PATENT AND TRADEMARK OFFICE
CERTIFICATE OF CORRECTION

| | | |
|---|---|---|
| PATENT NO. | : 6,771,070 B2 | Page 1 of 1 |
| APPLICATION NO. | : 09/822771 | |
| DATED | : August 3, 2004 | |
| INVENTOR(S) | : Ray F. Lee | |

It is certified that error appears in the above-identified patent and that said Letters Patent is hereby corrected as shown below:

At the first page of the patent, Col. 1, after the title on line 6, please add the following paragraph:

FEDERALLY SPONSORED RESEARCH OR DEVELOPMENT
This invention was made in part with United States Government support under HL062332, HL052315, HL056882 awarded by the National Institutes of Health. The U.S. Government has certain rights in the invention.

Signed and Sealed this
Sixth Day of December, 2011

David J. Kappos
*Director of the United States Patent and Trademark Office*